US012505791B2

(12) United States Patent
Ryu et al.

(10) Patent No.: US 12,505,791 B2
(45) Date of Patent: Dec. 23, 2025

(54) TILED DISPLAY DEVICE UTILIZING A RAIL FRAME AND MAGNETS

(71) Applicant: LG Display Co., Ltd., Seoul (KR)

(72) Inventors: Jae Won Ryu, Paju-si (KR); Han Seok Kim, Paju-si (KR); Seung Bum Heo, Paju-si (KR); Dae Yun Kim, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 18/633,225

(22) Filed: Apr. 11, 2024

(65) Prior Publication Data

US 2024/0371319 A1 Nov. 7, 2024

(30) Foreign Application Priority Data

May 2, 2023 (KR) .................. 10-2023-0057228

(51) Int. Cl.
*G09G 3/3208* (2016.01)
(52) U.S. Cl.
CPC .................. *G09G 3/3208* (2013.01)
(58) Field of Classification Search
None
See application file for complete search history.

(56) References Cited

U.S. PATENT DOCUMENTS

| 2020/0194539 | A1* | 6/2020 | Kim | H10K 71/00 |
| 2022/0108638 | A1* | 4/2022 | Schuettke | G09F 9/3026 |
| 2023/0038699 | A1* | 2/2023 | Maeng | G02F 1/133322 |
| 2023/0046091 | A1 | 2/2023 | Choi et al. | |
| 2023/0253388 | A1 | 8/2023 | Chung et al. | |
| 2023/0290916 | A1 | 9/2023 | Um et al. | |
| 2024/0040710 | A1* | 2/2024 | Wang | H05K 5/30 |
| 2024/0079397 | A1* | 3/2024 | Li | H05K 5/0221 |
| 2024/0411170 | A1* | 12/2024 | Li | G02F 1/1362 |

FOREIGN PATENT DOCUMENTS

| KR | 10-2022-0072535 A | 6/2022 |
| KR | 10-2023-0022418 A | 2/2023 |
| KR | 10-2023-0023482 A | 2/2023 |
| KR | 10-2023-0024469 A | 2/2023 |

* cited by examiner

*Primary Examiner* — Benjamin C Lee
*Assistant Examiner* — Emily J Frank
(74) *Attorney, Agent, or Firm* — Fenwick & West LLP

(57) ABSTRACT

A display device includes a plurality of display modules, a plurality of module brackets fastened to boundary areas between adjacent display modules to couple the adjacent display modules, a plurality of magnets disposed in the boundary area between the adjacent display modules, and a rail frame disposed above the plurality of module brackets and the plurality of magnets in the boundary area between the adjacent display modules and coupled by magnetic forces of the magnets.

19 Claims, 36 Drawing Sheets

TILED DISPLAY DEVICE UTILIZING A RAIL FRAME AND MAGNETS

CROSS-REFERENCE TO RELATED APPLICATION

This application claims priority to and the benefit of Republic of Korea Patent Application No. 2023-0057228, filed on May 2, 2023, which is hereby incorporated by reference in its entirety.

BACKGROUND

Field of the Invention

The present disclosure relates to a display device, and more specifically, to a display device to which a plurality of display modules are detachably attached using a rail frame.

Discussion of Related Art

Organic light emitting diode (OLED) display devices reproduce images as OLEDs disposed in each pixel emit light according to input image signals. Since OLED display devices have quick response time of pixels, high luminous efficiency and brightness, and wide viewing angles and may express a black gradation in complete black, the OLED display devices have excellent contrast ratio and color gamut. These OLED display devices do not require backlight units.

Recently, display devices using light emitting diodes (LEDs), which are inorganic light emitting elements used as light emitting elements for pixels, are attracting attention as next-generation display devices. Since an LED is made of an inorganic material, the LED does not require a separate encapsulation layer for protecting an organic material from moisture and has superior reliability and longer lifetime than the OLED. In addition, LEDs have fast lighting speed, excellent luminous efficiency, and impact resistance.

When the display device is driven, the image quality of images reproduced on a display panel is degraded due to electronic devices of which temperature characteristics change when a temperature distribution of the display panel is not uniform. For example, when a difference between maximum and minimum temperatures of the display panel increases, a color sense difference in which a specific color appears stronger may occur in the image displayed on the display panel.

SUMMARY

The present specification is directed to providing a display device, in which a temperature difference on a display panel is reduced, warpage of a display module including the display panel due to thermal expansion is minimized or at least reduced, and the attachment and detachment of the display module is easy.

Objects of the present specification are not limited to the above-described objects, and other objects that are not mentioned will be able to be clearly understood by those skilled in the art from the following description.

According to an aspect of one embodiment of the present specification, there is provided a display device including a plurality of display modules, a plurality of module brackets fastened to boundary areas between adjacent display modules to couple the adjacent display modules, a plurality of magnets disposed in the boundary areas between the adjacent display modules, and a rail frame disposed on the plurality of module brackets and the plurality of magnets in the boundary areas between the adjacent display modules and coupled by magnetic forces of the magnets.

According to another aspect of one embodiment of the present specification, there is provided a display device including a first display module, a second display module, a plurality of module brackets fastened to a boundary area between the first display module and second display module adjacent to each other to couple the adjacent first and second display modules, a plurality of magnets disposed in the boundary area between the adjacent first and second display modules, and a rail frame disposed on the plurality of module brackets and the plurality of magnets in the boundary area between the adjacent first display module and second display module and coupled by magnetic forces of the magnets.

In the present specification, it is possible to reduce a temperature difference on a display panel and minimize or at least reduce warpage of a display module including the display panel due to thermal expansion, and the attachment and detachment of the display module can be easy.

In the present specification, it is possible to firmly fix and separate a plurality of display modules to and from a rail frame using a magnet when a display is replaced.

In addition, in the present specification, it is possible to connect the rail frame to the display module using the magnet and minimize or at least reduce the warpage of the plurality of display modules using an attraction force.

In addition, in the present specification, it is possible to firmly fix the plurality of display modules using a plurality of magnets and the rail frame, and this structure allows heat generated from each display module to be transferred to the outside, thereby minimizing or at least reducing the thermal deformation of the plurality of display modules.

Furthermore, in the present specification, it is possible to solve problems of the warpage due to the thermal expansion of the plurality of display modules and a step which occurs on a boundary surface between the display modules.

In addition, in the present specification, since the plurality of display modules are easily attached to and detached from the rail frame using a module bracket and the magnet, it is possible to easily replace the display module.

In addition, in the present specification, by arranging a sub-magnet between a plurality of module brackets, it is possible to minimize or at least reduce the warpage which occurs between the plurality of module brackets.

Furthermore, in the present specification, it is possible to effectively reduce the warpage through the rail frame regardless of the arrangement of the display module.

In addition, in the present specification, it is possible to minimize or at least reduce the warpage due to the thermal expansion of the plurality of display modules using the magnet, thereby increasing the lifetime of the display modules.

In addition, in the present specification, since the heat generated from the plurality of display modules can be discharged to the outside through the plurality of magnet, the module bracket, and the rail frame, it is possible to reduce a temperature difference between the plurality of display modules to uniformly maintain a temperature distribution between the display modules, thereby improving the image quality of images reproduced on the display modules.

Effects which can be achieved by the present disclosure are not limited to the above-mentioned effects. That is, other objects that are not mentioned may be obviously understood by those skilled in the art to which the present disclosure pertains from the following description.

BRIEF DESCRIPTION OF THE DRAWINGS

The above and other objects, features, and advantages of the present disclosure will become more apparent to those of ordinary skill in the art by describing exemplary embodiments thereof in detail with reference to the attached drawings, in which.

DETAILED DESCRIPTION

Advantages and features of the present specification and methods for achieving them will become clear with reference to embodiments described below in detail in conjunction with the accompanying drawings. The present invention is not limited to the embodiments disclosed below but will be implemented in various different forms, these embodiments are merely provided to make the disclosure of the present invention complete and fully inform those skilled in the art to which the present invention pertains of the scope of the invention.

In describing the present invention, when it is determined that the detailed description of a related known technology may unnecessarily obscure the gist of the present invention, detailed description thereof will be omitted.

When the terms "comprises," "includes," "has," and "having" described in the present specification are used, other parts may be added unless "only" is used. When a component is expressed in the singular, it can be construed as a plurality of components unless specifically stated otherwise.

When the position relationship and interconnection relationship between two components, such as "on," "above," "under," "next to," "connected or coupled," "crossing or intersecting," or the like described, one or more other components may be interposed between the components unless the term "immediately" or "directly" is described.

When the temporal relationship is described using the term "after," "subsequently," "then," "before," or the like, it may include a non-consecutive case unless the term "immediately" or "directly" is used.

Although the term "first," "second," or the like may be used to distinguish components, functions or structures of the components are not limited by the ordinal number or component name added to the front of the component.

The following embodiments may be partially or fully coupled or combined, and various technological interworking and driving are possible. The embodiments may be implemented independently of each other and implemented together in the associated relationship.

In addition, terms (including technical and scientific terms) used in embodiments of the present specification may be construed as meaning that may be generally understood by those skilled in the art to which the present specification pertains unless explicitly specifically defined and described, and the meanings of the commonly used terms, such as terms defined in a dictionary, may be construed in consideration of contextual meanings of related technologies.

Hereinafter, exemplary embodiments according to the present invention will be described in detail with reference to the accompanying drawings.

Figure 1:
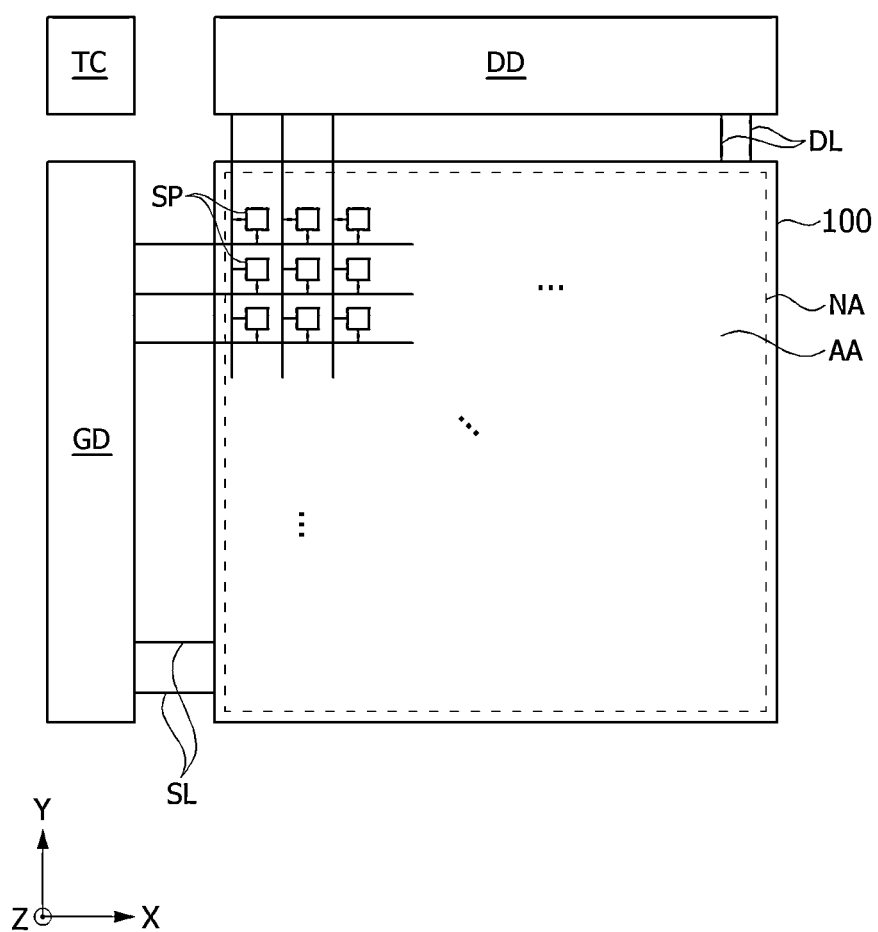
FIG. 1 is a block diagram schematically illustrating a configuration of a display device according to one embodiment of the present specification.

FIG. 1 is a block diagram schematically illustrating a configuration of a display device according to one embodiment of the present specification.

Referring to FIG. 1, the display device includes a display panel 100 in which a plurality of pixels are disposed on a display area AA, and a driving circuit for driving pixels.

The display panel 100 may be a panel with a rectangular structure having a length in a X-axis direction, a width in a Y-axis direction, and a thickness in a Z-axis direction. The pixels include a plurality of sub-pixels SP with different colors. The driving circuit includes a data driving unit DD (e.g., a circuit), a gate driving unit GD (e.g., a circuit), and a timing controller TC for controlling the gate driving unit GD and the data driving unit DD. In the display panel 100, the display area AA on which an input image is displayed may be a screen visible from a front surface of the display panel 100. Here, a width and length of the display panel 100 may be set to various design values depending on application fields of the display device. In addition, the X-axis direction may be a longitudinal direction or lateral direction, the Y-axis direction may be a width direction or breadth direction, and the Z-axis direction may be a vertical direction or thickness direction. In addition, the X-axis direction, the Y-axis direction, and the Z-axis direction may be perpendicular to each other, but may also be different directions which are not perpendicular to each other. Therefore, each of the X-axis direction, the Y-axis direction, and the Z-axis direction may be described as any one of a first direction, second direction, or third direction. In addition, a surface extending in the X-axis direction and Y-axis direction may indicate a horizontal surface.

An input image is displayed on the sub-pixels SP disposed on the display area AA of the display panel 100. Each of the sub-pixels SP includes a light emitting element and a pixel circuit for driving the light emitting device. The light emitting device may be a light emitting diode (LED) or micro LED.

A plurality of scan lines SL and a plurality of data lines DL are disposed to intersect each other on the display panel 100. Each of the sub-pixels SP is connected to the scan line SL and the data line DL. Power lines omitted in FIG. 1 may be connected to each of the sub-pixels SP. A non-display area NA may be disposed outside the display area AA in the display panel 100.

Figure 4:
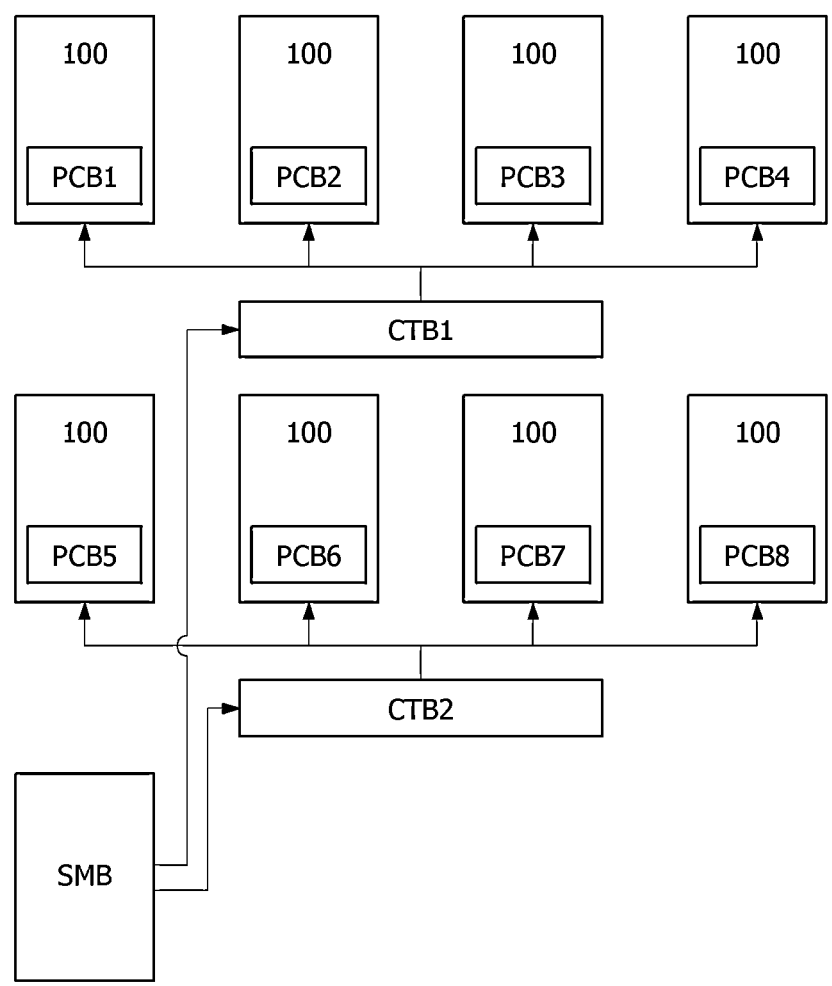
FIG. 4 is a block diagram schematically illustrating control boards connected to a plurality of printed circuit boards, and a system board connected to the control boards in the display device according to one embodiment of the present specification.

The gate driving unit GD supplies a scan signal to the scan lines SL in response to a gate control signal provided from the timing controller TC. The gate driving unit GD may be at least disposed on the non-display area NA of the display panel 100 as illustrated in FIG. 1 or disposed on the display area AA as illustrated in FIG. 4.

The data driving unit DD converts image data received from the timing controller TC into reference compensation voltages in response to data control signals provided from the timing controller TC and outputs data voltages. The data voltages output from the data driving unit DD are supplied to the data lines DL.

The timing controller TC sorts the image data input from the outside and supplies the sorted image data to the data driving unit DD. The timing controller TC may generate a gate control signal and a data control signal based on timing signals, which are synchronized with the input image signal, such as a dot clock signal, a data enable signal, and horizontal/vertical synchronization signals. The timing controller TC supplies the gate control signal to the gate driving unit GD and supplies the data control signal to the data driving unit DD to control operation timings of the gate driving unit GD and the data driving unit DD.

Link lines and pad electrodes for transmitting the signals to the sub-pixel SP of the display area AA may be disposed on the non-display area NA. In addition, at least one of a gate driver IC in which circuits of the gate driving unit GD are integrated and a data driver IC in which circuits of the data driving unit DD are integrated may be disposed on the non-display area NA. The non-display area NA may be positioned on a rear surface of the display panel 100, that is, a rear surface in which the sub-pixel SP is not present or minimized to a degree at which an image is invisible when the image is displayed on the display panel 100.

The driving units such as the gate driving unit GD, the data driving unit DD, and the timing controller TC may be connected to the display panel 100 in various ways. For example, the gate driving unit GD may be disposed on the non-display area NA in a gate in panel (GIP) method, and disposed between the sub-pixels SP in the display area AA in a gate in active area (GIA) method. For example, the data driving unit DD and the timing controller TC may be formed on a separate flexible film and printed circuit board (hereinafter referred to as "PCB"), and the data driving unit DD and the timing controller TC may be electrically connected to the display panel 100 by bonding the flexible film and the PCB to the pad electrodes formed in the non-display area NA of the display panel 100.

Figure 2:
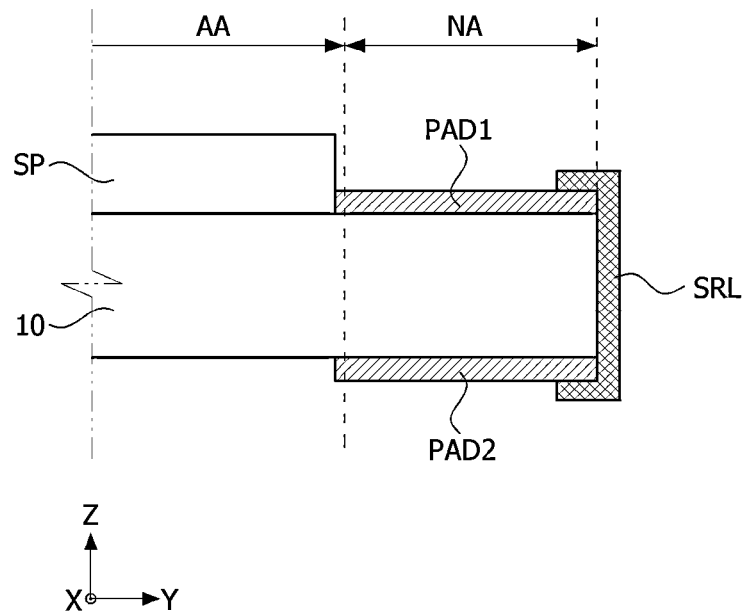
FIG. 2 is a partial cross-sectional view illustrating a pad part and a side line disposed on an outermost portion of a display panel according to one embodiment of the present specification.

Side lines for connecting the signal lines on the front surface of the display panel 100 to the pad electrodes on the rear surface of the display panel 100 may be formed on a side surface of an outermost portion of the display panel 100. A method of electrically connecting the front and rear surfaces of the display panel 100 through the side lines can minimally reduce the non-display area NA visible from the front surface of the display panel 100. In FIG. 2, "SRL" indicates the side line. When the gate driving unit GD, the data driving unit DD, and the timing controller TC are connected to the display panel 100 in the above manner, a substantially bezel-less screen can be implemented.

FIG. 2 is a partial cross-sectional view illustrating a pad part and a side line disposed on an outermost portion of a display panel according to the one embodiment of the present specification.

Referring to FIG. 2, a plurality of pad electrodes for transmitting various signals to the sub-pixels SP are disposed on the non-display area NA of the display panel 100. For example, a first pad electrode PAD1 for transmitting signals to the sub-pixels SP may be disposed on the non-display area NA disposed on the front surface of the display panel 100. A second pad electrode PAD2 electrically connected to circuit components such as the flexible film and the PCB is disposed on the non-display area NA disposed on the rear surface of the display panel 100. A size of the non-display area NA disposed on an outermost portion of the front surface of the display panel 100 on which the images are displayed can be minimized by arranging only a pad area in which the first pad electrode PAD1 is disposed.

Various signal lines connected to the sub-pixels SP, for example, the scan line SL, the data line DL, and the like may extend to the non-display area NA and may be electrically connected to the first pad electrode PAD1.

The display panel 100 may include the side line SRL disposed on the side surface of the outermost portion of the display panel 100. The side line SRL may connect the first pad electrode PAD1 disposed on the outermost portion of the front surface of the display panel 100 to the second pad electrode PAD2 disposed on an outermost portion of the rear surface of the display panel 100 across the side surface of the display panel 100. Signals output from the circuit components disposed on the rear surface of the display panel 100 may be transmitted to the sub-pixel SP in the display area AA through the second pad electrode PAD2, the side line SRL, and the first pad electrode PAD1. Therefore, by forming a signal transmission path which crosses the front, side, and rear surfaces of the outermost portion of the display panel 100, it is possible to minimize an area of the non-display area NA on the front surface of the display panel 100.

Figure 3:
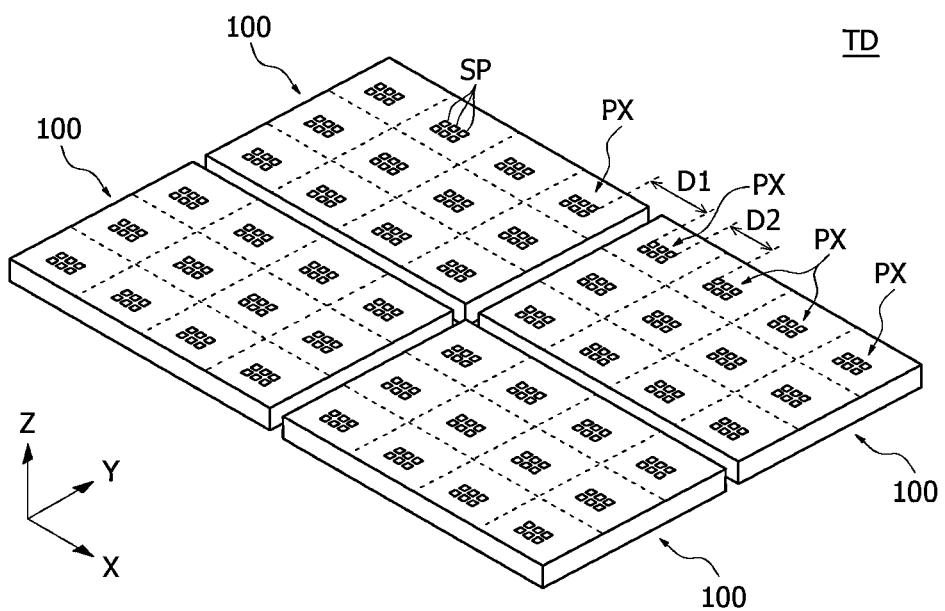
FIG. 3 is a schematic perspective view illustrating the display device according to one embodiment of the present specification.

FIG. 3 is a perspective view illustrating a tiling display device according to the one embodiment of the present specification.

As illustrated in FIG. 3, a plurality of display modules may be coupled in a plan view and implemented as a large-screen tiling display device. Each of the display modules can be implemented as a single display device and implemented as the large-screen tiling display device through a combination of the plurality of display modules. Each of the display modules may include the display panel 100, the driving circuit of the display panel PNL, and the circuit components and module cover members coupled to the rear surface of the display panel 100.

Referring to FIG. 3, a large-screen tiling display device TD includes a plurality of display modules disposed on an XY plane. Each of the display modules includes the display panel 100 for reproducing the input images. When the non-display area NA on the outermost portion of the front surface of each of the display panels 100 is minimized, the tiling display device TD may reproduce a large-screen image with an invisible seam between adjacent display panels 100.

In the tiling display device TD, outermost pixels PX of two adjacent display panels 100 are disposed to have a predetermined distance D1. In addition, adjacent pixels PX in the display area AA of the display panel 100 are also disposed to have the distance D1. As a result, the distance D1 between the pixels PX is the same throughout a large-screen display area of the tiling display device TD, and a seam area is invisible. Here, the distance D1 may be referred to as a first distance.

In the tiling display device TD, the plurality of display modules may share one timing controller TC. A host system may be connected to a plurality of timing controllers TC to transmit image signals to be reproduced on all display panels 100 which implement the large screen of the tiling display device TD to the timing controllers TC and may synchronize the timing controllers TC.

FIG. 4 is a block diagram schematically illustrating control boards connected to a plurality of printed circuit boards, and a system board connected to the control boards.

Referring to FIG. 4, each of the display modules may include one display panel 100 and one PCB. A system board SMB is connected to M control boards CTB1 and CTB2 (M is an integer of 2 or more). Each of the control boards CTB1 and CTB2 is connected to N PCBs (N is an integer greater than M).

The first control board CTB1 may be connected to PCBs (PCB1 to PCB4) of the first to fourth display modules through a flexible film or cable. The second control board CTB2 may be connected to PCBs (PCB5 to PCB8) of the fifth to eighth display modules through a flexible film or cable. The system board SMB may be connected to the first and second control boards CTB1 and CTB2 through a flexible film or cable.

The system board SMB may be a main board of the host system. The system board SMB includes a user interface port for receiving user inputs, an external interface port connected to external devices, a communication module for delaying various communication protocols, a processor for processing multi-media signals, a central processing unit (CPU), a main power supply unit, and the like. The system board SMB transmits the input image signal and the timing signal to the control boards CTB1 and CTB2. The timing controllers TC mounted on the control boards CTB1 and CTB2 transmit the received image signal to the data driving unit DD and controls the data driving unit DD and the gate driving unit GD based on the timing signal. The driving circuits DD and GD of the N display modules write image data to the corresponding display panel 100 under the control of one timing controller TC.

Figure 5:
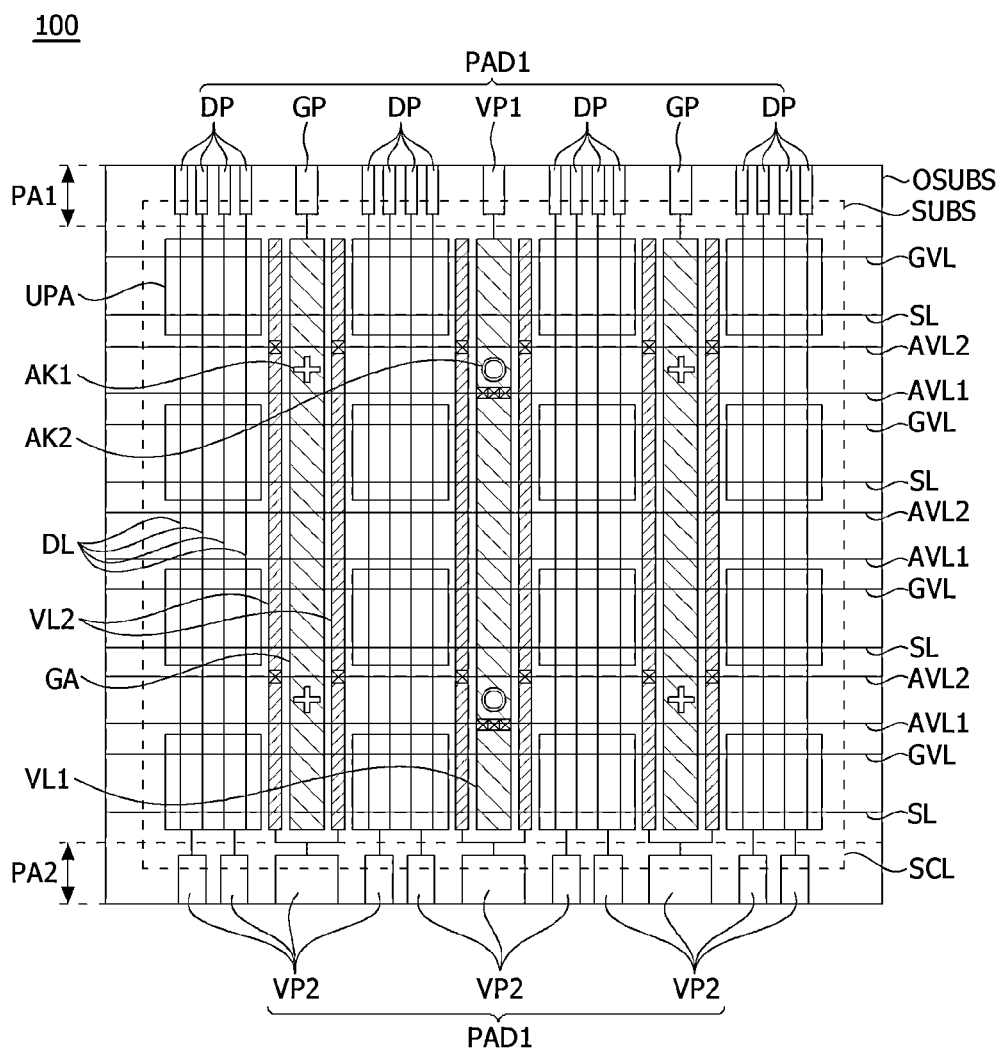
FIG. 5 is a plan view illustrating a planar structure of the display panel in the display device according to one embodiment of the present specification.

FIG. 5 is a plan view illustrating a planar structure of the display panel according to one embodiment of the present specification.

Referring to FIG. 5, the display panel 100 includes a substrate SUBS on which a pixel array and the circuits of the gate driving unit GD are disposed.

Figure 6:
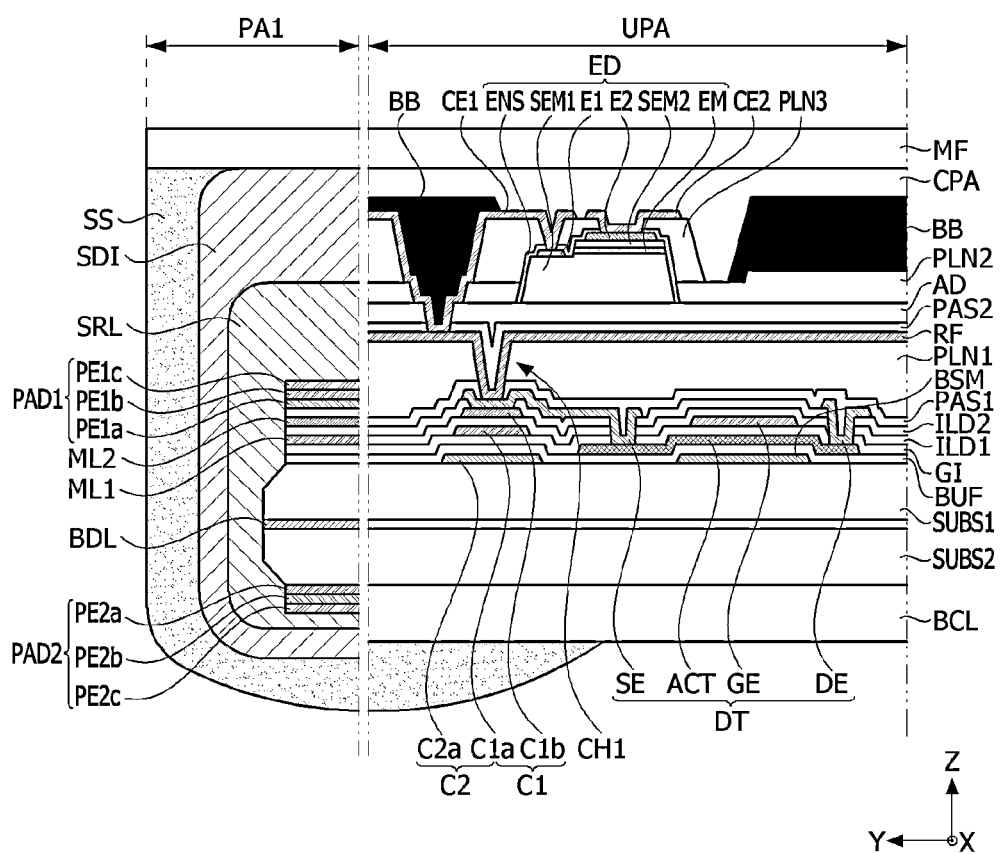
FIG. 6 is a cross-sectional view specifically illustrating a cross-sectional structure of the display panel in the display device according to one embodiment of the present specification.

The substrate SUBS may be an insulating substrate for supporting components disposed on an upper portion of the display device. As illustrated in FIG. 6, the substrate SUBS may have a structure in which first and second substrates SUBS1 and SUBS2 are stacked. Each of the first and second substrates SUBS1 and SUBS2 may be manufactured as glass, polymer resin, or plastic substrate. Each of the first and second substrates SUBS1 and SUBS2 may be manufactured as a flexible substrate, but is not limited thereto.

On one surface (or a front surface) of the substrate SUBS, the display area AA may include a plurality of pixel areas UPA, a plurality of gate driving areas GA, and a plurality of pad areas PA1 and PA2. One or more pixels PX may be disposed on each of the pixel areas UPA. The pixel areas UPA may be disposed along a plurality of row lines and a plurality of column lines. Each of the pixels PX includes a plurality of sub-pixels SP with different colors. Each of the sub-pixels SP may include a light emitting device and a pixel circuit and emit light independently. The sub-pixels SP may include a red sub-pixel, a blue sub-pixel, and a green sub-pixel, but is not limited thereto.

The plurality of gate driving areas GA include the circuits of the gate driving unit GD. The gate driving area GA may be formed in row and/or column directions between the plurality of pixel areas UPA. The gate driving unit GD formed in the gate driving area GA may provide a scan signal to the plurality of scan lines SL.

The first pad area PA1 includes a plurality of first pad electrodes PAD1 disposed on a front surface of an outermost portion of one side (or an upper side) of the display panel 100. The first pad electrodes PAD1 may transmit various signals to various lines extending in the column direction in the display area AA. The first pad electrodes PAD1 includes data pads DP connected to the data lines DL and for transmitting the data voltage from the data driving unit DD to the data lines DL, and gate pads GP connected to the gate driving unit GD and for transmitting a clock signal, a start signal, a gate low voltage, a gate high voltage, and the like for driving the gate driving unit GD to the gate driving unit GD. The clock signal, start signal, gate low voltage, gate high voltage, and the like for driving the gate driving unit GD may be generated from the timing controller TC and applied to the gate pads GP via a level shifter and the PCB. The first pad electrodes PAD1 may include a plurality of power supply lines to which a DC voltage (or a constant voltage) is applied.

The second pad area PA2 includes a plurality of first pad electrodes PAD1 disposed on a front surface of an outermost portion of the other side (or a lower side) of the display panel 100. The second pad area PA2 may include a plurality of low-potential power pads VP2.

The DC voltage applied to the power lines may be output from the power circuit omitted in the drawing and applied to the pads VP1 and VP2 connected to the power lines through the PCB. The power circuit may be a DC-DC converter disposed on the PCB or control boards CTB1 and CTB2 disposed on the rear surface of the display panel 100 to convert a DC input voltage from a main power supply unit into a direct voltage suitable for driving the display panel 100.

The power pads VP1 and VP2 connected to the power lines may include a plurality of high-potential power pad VP1 disposed on the first pad area PA1 to transmit a high-potential power voltage to a high-potential power line VL1, and a plurality of low-potential power pads VP2 disposed on the second pad area PA2 to transmit a low-potential power voltage to a low-potential power line VL2.

The data pad DP connected to each of the data lines DL may have a relatively smaller width, and the power pads VP1 and VP2 and the gate pads GP may have relatively larger widths. The low-potential power pads VP2 may have larger widths than the high-potential power pads VP1. The widths of the pads DP, GP, VP1, and VP2 are not limited to those of FIG. 5.

In order to minimize or reduce the outermost non-display area NA of the display panel 100, after the pixel array, lines, and pads are formed on a front surface of the substrate SUBS of the display panel 100, the substrate SUBS is cut along a scribing line SCL. Therefore, the substrate SUBS may be provided by removing a portion OSUBS outside the scribing. After the scribing process, rough edges on a side surface of an outermost portion of the substrate SUBS may be ground or laser-trimmed. As described above, short pad electrodes PAD1 and PAD2 remain on the front surface of the outermost portion of the substrate SUBS with the reduced size.

The data lines DL may extend in the column direction (Y direction) on the first substrate SUBS and overlap the pixel area UPA. The data lines DL supply data voltages to the pixel circuit of each sub-pixel SP. The scan lines SL may extend in the row direction (X direction) on the substrate SUBS of the display panel 100 and overlap the pixel area UPA and the gate driving area GA. The scan lines SL may supply the scan signal from the gate driving unit GD to the pixel circuit of each of the sub-pixels SP across the pixel area UPA and the gate driving area GA.

The high-potential power lines VL1 extend in the column direction (Y direction), and at least one of the high-potential power lines VL1 is connected to an auxiliary high-potential power line AVL1 extending in the row direction (X direction) in a mesh structure. The auxiliary high-potential power lines AVL1 are connected to the sub-pixels SP disposed in the row direction (X direction). Therefore, the high-potential power voltage applied to the high-potential power lines VL1 may be transmitted to the sub-pixels SP through the auxiliary high-potential power lines AVL1.

The low-potential power lines VL2 extend in the column direction (Y direction), and at least one of the low-potential power lines VL2 is connected to an auxiliary low-potential power line AVL2 extending in the row direction (X direction) in a mesh structure. The auxiliary low-potential power lines AVL2 are connected to the sub-pixels SP disposed in the row direction (X direction). Therefore, the sub-pixels SP are connected to the auxiliary high-potential power lines AVL1 to which the low-potential power voltages are applied.

Due to the mesh structure of the power lines, resistances of the power lines can be reduced, thereby improving a voltage drop of the high-potential power voltage and a deviation of the power voltage in the display area AA.

A plurality of gate driving lines GVL extending in the row direction are disposed on the first substrate SUBS1 of the display panel 100. The plurality of gate driving lines GVL transmit signals necessary for driving the gate driving unit GD disposed on the gate driving area GA, such as a clock signal, a start signal, a gate high voltage, and a gate low voltage.

The substrate SUBS of the display panel 100 may include one or more alignment keys AK1 and AK2 disposed between the pixel areas UPA. The alignment keys AK1 and AK2 may be used for alignment in the manufacturing process of the display panel 100. The first alignment key AK1 may be disposed on the gate driving area GA. The first alignment key AK1 may be used to check an alignment position of each of the light emitting devices. The first alignment key AK1 may be formed in a cross pattern, but is not limited thereto. The second alignment key AK2 may overlap the high-potential power line VL1. The high-potential power line VL1 includes a hole formed at a position overlapping the second alignment key AK2 to distinguish the second alignment key AK2 from the high-potential power line VL1. The second alignment key AK2 may be used to align the display panel 100 with a donor substrate. The donor substrate is an intermediate medium for mounting the light emitting device on the substrate SUBS of the display panel 100. A plurality of light emitting devices manufactured on a semiconductor wafer may be transported after being attached to the donor substrate, and the light emitting devices attached on the donor substrate may be transferred onto the substrate SUBS. The second alignment key AK2 may be formed in a circular or ring pattern, but is not limited thereto.

FIG. 6 is a cross-sectional view illustrating a cross-sectional structure of the display panel according to the one embodiment of the present specification.

Referring to FIG. 6, a pixel circuit for driving a light emitting device ED is disposed in each of the plurality of sub-pixels SP on the first substrate SUBS1. The pixel circuit may include a plurality of thin film transistors and one or more capacitors. Although a driving transistor DT, a first capacitor C1, and a second capacitor C2 used for the pixel circuit are illustrated for convenience of description, the display panel 100 may further include other circuit elements.

A pattern of a first metal layer may be disposed on the first substrate SUBS1. The pattern of the first metal layer may include a light blocking layer BSM. The light blocking layer BSM can minimize or at least reduce a leakage current by blocking light incident on an active layer ACT of the driving transistor DT. The light blocking layer BSM may be made of an opaque conductive material, for example, a metal such as copper (Cu), aluminum (Al), molybdenum (Mo), nickel (Ni), titanium (Ti), or chromium (Cr), made of an alloy of these metals, or formed as a plurality of metal layers.

A buffer layer BUF may be disposed on the light blocking layer BSM. The buffer layer BUF may block moisture or impurities from being introduced through the first substrate SUBS1. The buffer layer BUF may be made of silicon oxide ($SiO_x$), silicon nitride ($SiN_x$), or a plurality of insulating layers.

The driving transistor DT including the active layer ACT, a gate electrode GE, a source electrode SE, and a drain electrode DE may be disposed on the buffer layer BUF.

The active layer ACT may be made of a semiconductor material such as oxide semiconductor, amorphous silicon, or polysilicon, but is not limited thereto. A gate insulating layer GI electrically insulates the active layer ACT from the gate electrode GE of the driving transistor DT. The gate insulating layer GI may be made of silicon oxide ($SiO_x$), silicon nitride ($SiN_x$), or a plurality of insulating layers.

A pattern of the second metal layer may be disposed on the gate insulating layer GI. The pattern of the second metal layer may include the gate electrode GE of the driving transistor DT. The second metal layer may be made of copper (Cu), aluminum (Al), molybdenum (Mo), nickel (Ni), titanium (Ti), chromium (Cr), or a plurality of metal layers.

A first interlayer insulating layer ILD1 and a second interlayer insulating layer ILD2 are disposed on the gate electrode GE. The first interlayer insulating layer ILD1 and the second interlayer insulating layer ILD2 have contact holes for connecting each of the source electrode SE and drain electrode DE of the driving transistor DT to the active layer ACT. Each of the first interlayer insulating layer ILD1 and the second interlayer insulating layer ILD2 may be made of silicon oxide ($SiO_x$), silicon nitride ($SiN_x$), a plurality of insulating layers.

A pattern of a third metal layer may be disposed on the second interlayer insulating layer ILD2. The pattern of the third metal layer may include the source electrode SE and the drain electrode DE connected to the active layer ACT through the contact holes overlapping the active layer ACT and passing through the interlayer insulating layers ILD1 and ILD2. The source electrode SE may be connected to the capacitors C1 and C2 and a first electrode E1 of the light emitting device ED. The third metal layer may be made of copper (Cu), aluminum (Al), molybdenum (Mo), nickel (Ni), titanium (Ti), chromium (Cr), or a plurality of metal layers.

The first capacitor C1 includes a first capacitor electrode C1$a$ and a second capacitor electrode C1$b$. The first capacitor electrode C1$a$ may be formed in a pattern of the second metal layer disposed on the gate insulating layer GI. The second capacitor electrode C1$b$ is formed in a pattern of a fourth metal layer disposed on the first interlayer insulating layer ILD1 and overlaps the first capacitor electrode C1$a$ with the first interlayer insulating layer ILD1 interposed therebetween. The second capacitor electrode C1$b$ may be connected to the source electrode SE of the driving transistor DT. The fourth metal layer may be made of copper (Cu), aluminum (Al), molybdenum (Mo), nickel (Ni), titanium (Ti), chromium (Cr), or a plurality of metal layers.

The second capacitor C2 includes a third capacitor electrode C2a overlapping the first capacitor electrode C1a with the buffer layer BUF and the gate insulating layer GI interposed therebetween. The third capacitor electrode C2a may be formed in the pattern of the first metal layer disposed on the first substrate SUBS1.

Since the second capacitor C2 is electrically connected between the source electrode SE of the driving transistor DT and the light emitting device ED to increase a capacitance of the light emitting device ED, the brightness can be increased when the light emitting device ED emits light.

A first passivation layer PAS1 covers the pattern of the third metal layer and the second interlayer insulating layer ILD2 to cover the pattern of the third metal layer. The first passivation layer PAS1 may be made of silicon oxide (SiO$_x$), silicon nitride (SiN$_x$), or a plurality of insulating layers.

A first planarization layer PLN1 is disposed on the first passivation layer PAS1. The first planarization layer PLN1 covers the first passivation layer PAS1 and planarizes a surface on which the light emitting device is disposed. The first planarization layer PLN1 may be a thick single organic insulating layer or a plurality of organic insulating layers made of benzocyclobutene or an acryl-based organic material.

A pattern of a fifth metal layer may be disposed on the first planarization layer PLN1. The pattern of the fifth metal layer may include a reflective layer RF. The reflective layer RF can increase light efficiency by reflecting light from the light emitting device ED toward the front surface of the display panel 100 and can be used as an electrode connecting the light emitting device ED to the pixel circuit or power line. The reflective layer RF may be electrically connected to the source electrode SE of the driving transistor DT and the first capacitor C1 through a contact hole CH1 passing through the first planarization layer PLN1 and the first passivation layer PAS1. In addition, the reflective layer RF may be electrically connected to the first electrode E1 of the light emitting device ED through a first connection electrode CE1 or may electrically connect a second electrode E2 of the light emitting device ED to the high-potential power line VL1. The fifth metal layer may be made of silver (Ag), aluminum (Al), molybdenum (Mo), titanium (Ti), a transparent electrode material such as indium tin oxide (ITO), or a plurality of metal layers.

The second passivation layer PAS2 covers the pattern of the fifth metal layer and the first planarization layer PLN1. The second passivation layer PAS2 may be made of silicon oxide (SiO$_x$), silicon nitride (SiN$_x$), or a plurality of insulating layers.

An adhesive layer AD may be disposed on the second passivation layer PAS2 to fix the light emitting device ED. The adhesive layer AD may be made of a photocurable resin which may be cured by light. The adhesive layer AD may be made of an acrylic-based material containing a photosensitive agent, but is not limited thereto. The adhesive layer AD may be formed on the front surface of the first substrate SUBS1 excluding the pad areas PA1 and PA2 in which the first pad electrode PAD1 are disposed.

The light emitting device ED of each of the sub-pixels SP may be disposed on the adhesive layer AD. The light emitting devices ED may emit light by a current from the driving transistor DT. The light emitting devices ED may include a red light emitting device ED, a green light emitting device ED, and a blue light emitting device ED. The light emitting device ED may be a LED or micro LED.

Each of the light emitting devices ED includes a first semiconductor pattern SEM1, a light emitting layer EM, a second semiconductor pattern SEM2, the first electrode E1, and the second electrode E2.

The first semiconductor pattern SEM1 is disposed on the adhesive layer AD, and the second semiconductor pattern SEM2 is disposed on the first semiconductor pattern SEM1. The first semiconductor pattern SEM1 and the second semiconductor pattern SEM2 may be formed as semiconductor patterns obtained by doping n-type and p-type impurities into a semiconductor material. For example, each of the first semiconductor pattern SEM1 and the second semiconductor pattern SEM2 may be a layer obtained by doping the n-type or p-type impurities into a material such as gallium nitride (GaN), indium aluminum phosphide (InAlP), and gallium arsenide (GaAs). In addition, although the p-type impurity may be magnesium, zinc (Zn), beryllium (Be), or the like, and the n-type impurity may be silicon (Si), germanium, tin (Sn), or the like, the present invention are not limited thereto.

The light emitting layer EM is disposed between the first semiconductor pattern SEM1 and the second semiconductor pattern SEM2. The light emitting layer EM may receive holes and electrons from the first semiconductor pattern SEM1 and the second semiconductor pattern SEM2 and emit light. The light emitting layer EM may be formed in a single-layer or multi-quantum well (MQW) structure and made of, for example, indium gallium nitride (InGaN) or gallium nitride (GaN).

The first electrode E1 is disposed on the first semiconductor pattern SEM1. The first electrode E1 electrically connects the driving transistor DT to the first semiconductor pattern SEM1. The first semiconductor pattern SEM1 may be formed of a semiconductor layer doped with n-type impurities. The first electrode E1 may be an anode of the light emitting device ED disposed on the first semiconductor pattern SEM1 and electrically connected to the driving transistor DT and the capacitors C1 and C2 via the reflective layer RE. The first electrode E1 may be disposed on an upper surface of the first semiconductor pattern SEM1. The first electrode E1 may be made of a conductive material, for example, a transparent conductive material such as ITO or indium zinc oxide (IZO), an opaque conductive material such as titanium (Ti), gold (Au), silver (Ag), copper (Cu), an alloy thereof, or the like.

The second electrode E2 is disposed on the second semiconductor pattern SEM2. The second electrode E2 electrically connects the high-potential power line VL1 to the second semiconductor layer SEM2. The second semiconductor layer SEM2 may be formed as a semiconductor layer doped with p-type impurities. The second electrode E2 may be a cathode of the light emitting device ED. The second electrode E2 may be made of a conductive material, for example, a transparent conductive material such as ITO or IZO, an opaque conductive material such as titanium (Ti), gold (Au), silver (Ag), copper (Cu), an alloy thereof, or the like.

The light emitting device ED may include an encapsulation layer ENS. The sealing layer ENS covers the semiconductor patterns SEM1 and SEM2 and the electrodes E1 and E2 and protects the light emitting device ED. The encapsulation layer ENS and a third planarization layer PLN3 include contact holes exposing the first electrode E1 and the second electrode E2. The first connection electrode CE1 is connected to the reflective layer RE through a first contact hole passing through the encapsulation layer ENS and the third planarization layer PLN3. The second connection electrode CE2 is connected to the second electrode E2 through a second contact hole passing through the encapsulation layer ENS and the third planarization layer PLN3. Meanwhile, a portion of a side surface of the first semiconductor pattern SEM1 may be exposed due to no encapsulation layer ENS.

The second planarization layer PLN2 and the third planarization layer PLN3 may cover the adhesive layer AD and the light emitting device ED. The second planarization layer PLN2 comes into contact with a lower end of a side surface of the light emitting device ED and fixes the light emitting device ED. The third planarization layer PLN3 covers the light emitting device ED above the second planarization layer PLN2. The third planarization layer PLN3 includes contact holes exposing the first electrode E1 and the second electrode E2 of the light emitting device ED. The second planarization layer PLN2 and the third planarization layer PLN3 may be made of a single-layer organic insulating material or a plurality of organic insulating materials, such as a photoresist or acryl-based organic material.

A pattern of a sixth metal layer may be disposed on the third planarization layer PLN3. The sixth metal layer may include the first connection electrode CE1 and the second connection electrode CE2. The first connection electrode CE1 electrically connects the first electrode E1 of the light emitting device ED to the reflective layer RE. The first connection electrode CE1 may be connected to the first electrode E1 of the light emitting device ED through a contact hole passing through the insulating layers PLN3 and ENS and connected to the reflective layer RF through a contact hole passing through the insulating layers PAS2, AD, PLN2, and PLN3.

The second connection electrode CE2 is connected to the second electrode E2 of the light emitting device ED through the contact hole passing through the insulating layers PLN3 and ENS. The second connection electrode CE2 may be connected to the low-potential power line VL2.

According to the embodiment, although it is illustrated that the light emitting device ED has a horizontal structure in which the connection electrodes CE1 and CE2 are connected to the upper surfaces of the first semiconductor pattern SEM1 and the second semiconductor pattern SEM2, the present disclosure is not necessarily limited thereto. For example, the light emitting device ED may have a vertical structure in which the first connection electrode CE1 is disposed under the first semiconductor pattern SE1.

A bank pattern BB may be disposed on the second planarization layer PLN2. The bank pattern BB may be spaced a predetermined distance from the light emitting device ED. The bank pattern BB may cover a portion of the first connection electrode CE1 which is present in the contact hole passing through the insulating layers PLN2 and PLN3. The bank pattern BB can reduce color mixing between the sub-pixels SP by preventing optical crosstalk between the sub-pixels SP. To this end, the bank pattern BB may be made of a black resin, but is not limited thereto.

A first protective layer CPA may cover the patterns CE1 and CE2 of the sixth metal layer, the bank pattern BB, the second planarization layer PLN2, and the third planarization layer PLN3. The first protective layer CPA may be formed of a single insulating layer, a plurality of insulating layers, or the like made of a translucent epoxy, silicon oxide ($SiO_x$), or silicon nitride ($SiN_x$).

Each of the first pad electrodes PAD1 disposed on the pad areas PA1 and PA2 of the first substrate SUBS1 may have a structure of a plurality of metal layers. For example, each of the first pad electrodes PAD1 may include a first pad metal layer PE1$a$, a second pad metal layer PE1$b$, and a third pad metal layer PE1$c$ stacked on the front surface of the outermost portion of the first substrate SUBS1.

The pattern of the third metal layer disposed on the second interlayer insulating layer ILD2 may further include the first pad metal layer PE1$a$. The first pad metal layer PE1$a$ may be made of the same metal as that of the source electrode SE and the drain electrode DE of the driving transistor DT, such as copper (Cu), aluminum (Al), molybdenum (Mo), nickel (Ni), titanium (Ti), chromium (Cr), or a plurality of metal layers.

The pattern of the fifth metal layer disposed on the first planarization layer PLN1 may further include the second pad metal layer PE1$b$. The second pad metal layer PE1$b$ may be made of the same metal as that of the reflective layer RF, such as silver (Ag), aluminum (Al), molybdenum (Mo), or a plurality of metal layers.

The pattern of the sixth metal layer disposed on the third planarization layer PLN3 may further include the third pad metal layer PE1$c$. The third pad metal layer PE1$c$ may be made of the same conductive material as those of the first connection electrode CE1 and the second connection electrode CE2, for example, a transparent conductive material such as ITO or IZO, or a plurality of metal layers or the like.

A first metal layer ML1, a second metal layer ML2, and a plurality of insulating layers may be disposed under the first pad electrodes PAD1. A step of the first pad electrode PAD1 may be adjusted by arranging the first metal layer ML1, the second metal layer ML2, and the plurality of insulating layers under the first pad electrode PAD1. For example, the buffer layer BUF, the gate insulating layer GI, the first metal layer ML1, the first interlayer insulating layer ILD1, and the second interlayer insulating layer ILD1 may be sequentially disposed between the first pad electrode PAD1 and the first substrate SUBS1. The pattern of the second metal layer disposed on the gate insulating layer GI may include the first metal layer ML1. The pattern of the fourth metal layer disposed on the first interlayer insulating layer ILD1 may include the second metal layer ML2. The plurality of insulating layers and metal layers ML2 and ML3 under the first pad electrodes PAD1 are not limited to those of FIG. 6.

The second substrate SUBS2 may be disposed on the rear surface of the first substrate SUBS1. A bonding layer BDL is disposed between the first substrate SUBS1 and the second substrate SUBS2. The bonding layer BDL is cured through various curing methods to bond the first substrate SUBS1 and the second substrate SUBS2. The bonding layer BDL may be disposed only on a partial area between the first substrate SUBS1 and the second substrate SUBS2 or disposed on the entire area. The first substrate SUBS1 and the second substrate SUBS2 may be scribed and ground at the same time so that the side surfaces of the first substrate SUBS1 and the second substrate SUBS2 may be formed as side surfaces without any step.

A plurality of second pad electrodes PAD2 may be disposed on a rear surface of an outermost portion of the second substrate SUBS2. The second pad electrodes PAD2 are electrically connected to the side lines SRL and the first pad electrode PAD1 to transmit signals from circuit components disposed on the rear surface of the second substrate SUBS2 to the sub-pixels SP disposed on the upper surface of the first substrate SUBS1.

Each of the second pad electrodes PAD2 may have a structure of a plurality of metal layers. For example, each of the second pad electrodes PAD2 may include a first pad metal layer PE2a, a second pad metal layer PE2b, and a third pad metal layer PE2c stacked on the rear surface of the outermost portion of the second substrate SUBS2. Each of the first and second pad metal layers PE2a and PE2b may be made of copper (Cu), aluminum (Al), molybdenum (Mo), nickel (Ni), titanium (Ti), or chromium (Cr), or formed of a plurality of metal layers. The third pad metal layer PE2c may be made of a transparent conductive material such as ITO or IZO.

A second protective layer BCL may be disposed on the rear surface of the second substrate SUBS2. The second protective layer BCL may cover various lines except for the second pad electrodes PAD2 on the rear surface of the second substrate SUBS2. The second protective layer BCL may be made of an organic insulating material, for example, benzocyclobutene or an acryl-based organic insulating material.

Circuit components such as a plurality of flexible films and a PCB may be disposed on the rear surface side of the second substrate SUBS2. Output terminals of the flexible film are electrically connected to the second pad electrode PAD2, and input terminals of the flexible film are electrically connected to output terminals of the PCB. Therefore, the signals or voltages output from the PCB may be transmitted to the sub-pixels SP disposed on the front surface of the first substrate SUBS1 through the flexible film, the second pad electrode PAD2, the side line SRL, the plurality of first pad electrodes PAD1, and the lines connected to the first pad electrode PAD1.

The side lines SRL electrically connect the first pad electrodes PAD1 to the second pad electrodes PAD2 across the side surfaces of the first substrate SUBS1 and the second substrate SUBS2. The side lines SRL may be formed on the side surfaces of the substrates SUBS1 and SUBS2 in a pad printing method using conductive ink, for example, conductive ink containing silver (Ag), copper (Cu), molybdenum (Mo), chromium (Cr), or the like.

A side insulating layer SDI may cover the side lines SRL formed on the upper, side, and rear surfaces of the outermost portions of the bonded substrates SUBS1 and SUBS2. When the side lines SRL are made of a metal, external light may be reflected from the side lines SRL, or light emitted from the light emitting device ED may be reflected from the side lines SRL to be visible to the user. In order to suppress the degradation in image quality due to reflected light, the side insulating layer SDI may include a black material for absorbing external light. For example, the side insulating layer SDI may be formed on the outermost portions of the substrates SUBS1 and SUBS2 with black ink which can be applied in a printing method.

A seal SS covers the side insulating layer SDI to protect the display panel 100 from an external impact, moisture, oxygen, or the like. For example, the seal SS may be made of a black ink, polyimide (PI), polyurethane, epoxy, or acryl-based insulating material or the like. The seal SS may have a concept which includes the side insulating layer SDI. In other words, the seal SS and the side insulating layer SDI may be formed as one layer.

A functional film MF may cover the front surface of the first display panel 100. The functional film MF may be one or more among various functional films such as an anti-shattering film, an anti-glare film, an anti-reflecting film, a low-reflecting film, an OLED transmittance controllable film, a color difference compensation film, and a polarizer. The anti-shattering film prevents or at least reduces pieces or particles of the substrate from scattering when the display panel 100 is broken. The functional film MF may be removed by being cut together with an outer portion of the seal SS along a cutting line overlapping with the seal SS after the seal SS is widely bonded to the front surface of the first substrate SUBS1. As a result, the side surfaces exposed at the outermost portions of the functional film MF and the seal SS may form the same side surface without any step.

Figure 7:
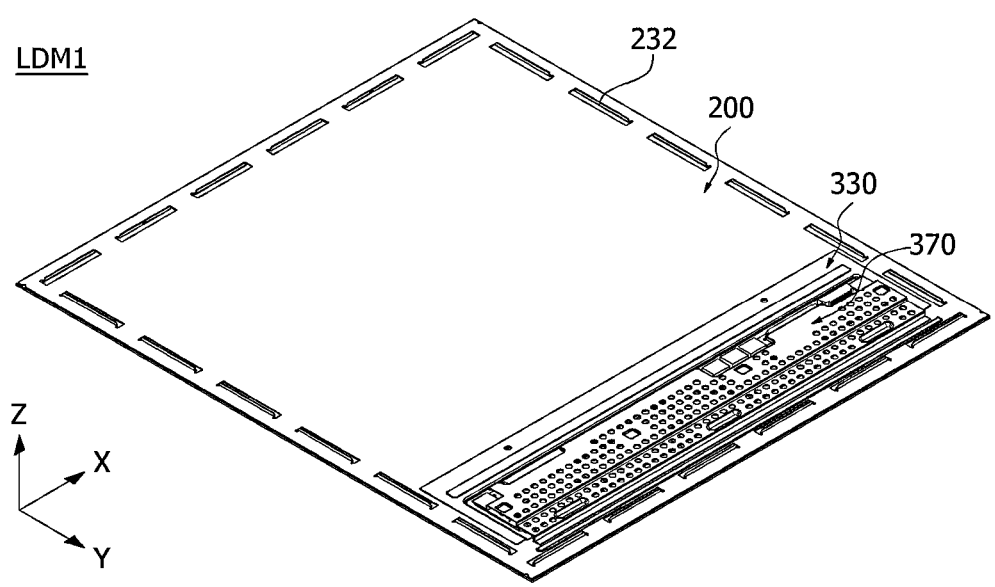
FIG. 7 is a perspective view illustrating a display module according to the one embodiment of present specification.
Figure 8:
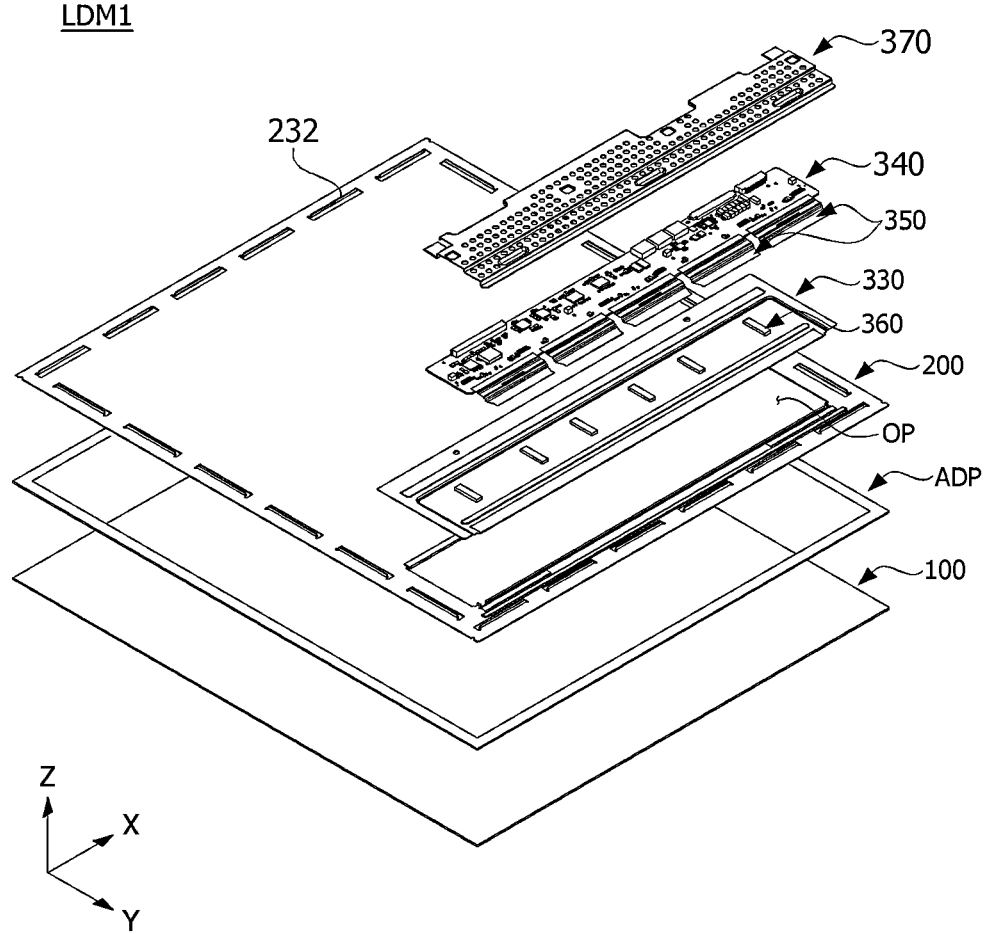
FIG. 8 is an exploded perspective view of the display module of FIG. 7 according to the one embodiment of present specification.

FIG. 7 is a perspective view illustrating a display module according to one embodiment. FIG. 8 is an exploded perspective view of the display module of FIG. 7 according to one embodiment.

Referring to FIGS. 7 and 8, a display module LDM1 according to an embodiment may include the display panel 100 including a front surface on which images are implemented and a rear surface which is a surface opposite to the front surface, a cover bottom 200 disposed on the rear surface of the display panel 100, a plate bottom 330 disposed in contact with the display panel 100 in a through hole OP of the cover bottom 200, a circuit board 340, at least one flexible film 350 connecting the display panel 100 to the circuit board 340 through the through hole OP, and at least one rib 360 disposed between the plate bottom 330 and the circuit board 340. In addition, the display module LDM1 may include a cover shield 370 for covering the circuit board 340.

The display module LDM1 may further include an adhesive member ADP for coupling the display panel 100 to the cover bottom 200. The adhesive member ADP may be disposed between the cover bottom 200 and the display panel 100 along an edge of the display module. The adhesive member ADP may be a foam tape with double-sided adhesiveness, but is not limited thereto.

In addition, the display module LDM1 according to the embodiment may include a gasket (not illustrated) disposed between the printed circuit board 340 and the cover shield 370 for grounding. Here, the flexible film 350 may be a chip on film (COF) on which an IC in which the circuits of the data driving unit DD and/or the gate driving unit GD are integrated is mounted.

A significant amount of heat may be generated from the flexible film 350 due to the IC. In addition, since the second pad electrodes PAD2 and the plurality of lines, which are made of a metal material, are densely disposed on one area of the rear surface of the display panel 100 to which the flexible film 350 is connected, a high heat source area D (see FIG. 14) may be formed near the second pad electrodes PAD2.

The display device according to the embodiment of the present specification can reduce a temperature difference between the high heat source area D and other areas of the display panel 100 by discharging heat to the outside using the plate bottom 330. In this case, the display device according to the embodiment of the present specification may quickly discharge heat generated from the high heat source area D to the outside using the plate bottom 330 made of a heterogeneous material with higher thermal conductivity than the cover bottom 200.

In addition, the display panel 100, the cover bottom 200, the plate bottom 330, and the cover shield 370 may form the exterior of the display module LDM1 according to the embodiment, and the module cover member may include the cover bottom 200, the plate bottom 330, and the cover shield 370.

The display panel 100 may be formed in a plate shape with a predetermined thickness and may include the front surface on which images are implemented and the rear surface opposite to the front surface. Here, the rear surface may be one surface of the display panel 100 disposed at the top with respect to the Z direction in the drawing. In addition, the front surface of the display panel 100 may be referred to as a first panel surface, and the rear surface of the display panel 100 may be referred to as a second panel surface.

In addition, the display panel 100 may be electrically connected to the circuit board 340 using the flexible film 350.

The adhesive member ADP is disposed between the cover bottom 200 and the display panel 100. The adhesive member ADP may be made of an adhesive material to secure the cover bottom 200 to the rear surface of the display panel 100. The adhesive member ADP may be disposed along the edge of the display panel 100 and an edge of the cover bottom 200. The adhesive member ADP may be formed in a frame shape corresponding to the edge of the display panel 100. For example, the adhesive member ADP may be an adhesive foam tape, but is not limited thereto.

The adhesive member ADP may be disposed adjacent to the edge of the cover bottom 200.

In addition, the cover bottom 200 may support and protect the display panel 100 on the rear surface of the display panel 100. The cover bottom 200 may have a shape corresponding to a planar shape of the display panel 100 and cover the display panel 100. The cover bottom 200 may be made of a material, which has rigidity and high thermal conductivity and made of a material a metal material such as aluminum (Al), copper (Cu), zinc (Zn), silver (Ag), gold (Au), iron (Fe), a stainless steel, or Invar, or a material such as plastic.

The cover bottom 200 includes the through hole OP, an opening 230, and a plurality of protruding portions 232.

The through hole OP of the cover bottom 200 is formed to correspond to the plurality of flexible films 350 and the printed circuit board 340. The through hole OP may be positioned in an area in which the plurality of flexible films 350 are bonded to the display panel 100. For example, the flexible film 350 may be bonded to an area adjacent to an edge of one side of the display panel 100, and the through hole OP may also be formed to correspond to an area adjacent to the edge of the one side of the display panel 100.

In addition, the flexible film 350 and the printed circuit board 340 may pass through the through hole OP and may be disposed on the rear surface of the cover bottom 200. Therefore, the plurality of flexible films 350 and the printed circuit board 340 may be disposed on the cover bottom 200 without separately providing the area in which the plurality of flexible films 350 and the printed circuit board 340 are disposed between the cover bottom 200 and the display panel 100. In this case, the plate bottom 330 may be seated in the through hole OP of the cover bottom 200 to support the printed circuit board 340.

Meanwhile, the display panel 100 and the cover bottom 200 may be connected through the adhesive member ADF along the edge of the cover bottom 200.

The plate bottom 330 is disposed between the printed circuit board 340 and the through hole OP of the cover bottom 200. A portion of the plate bottom 330 may cover an edge of the other side of the through hole OP and the cover bottom 200, and the other portion of the plate bottom 330 may be disposed in the through hole OP. The plate bottom 330 may pass through the through hole OP and support the printed circuit board 340 disposed on the cover bottom 200. For example, the plate bottom 330 may be disposed in contact with the display panel 100 outside the printed circuit board 340 and spaced apart from the display panel 100 in an area overlapping the printed circuit board 340 to support the printed circuit board 340.

The plate bottom 330 may extend to the outside of the through hole OP and be disposed to overlap the rear surface of the cover bottom 200. For example, the plate bottom 330 may extend from the through hole OP toward a central portion of the display panel 100 and be disposed to overlap the rear surface of the cover bottom 200.

In this case, an area in which one ends of the plurality of flexible films 350 are bonded to a display panel PN may be a partial area of the through hole OP not overlapping the plate bottom 330. The one ends of the plurality of flexible films 350 may overlap the through hole OP and may be disposed to be spaced apart from the plate bottom 330.

The plate bottom 330 may distribute and dissipate the heat generated from the printed circuit board 340. In addition, the plate bottom 330 can minimize or at least reduce the concentration of the heat generated from the printed circuit board 340 on a specific area of the display panel 100 by preventing the direct contact between the printed circuit board 340 and the display panel 100. Specifically, the printed circuit board 340 may include a plurality of components and some driving chips from which heat is significantly generated among the plurality of components may be disposed thereon. The plate bottom 330 may distribute the heat generated from some driving chips of the printed circuit board 340 to the entirety of the plate bottom 330, thereby preventing or at least reducing heat from being concentrated on some areas of the display panel 100 adjacent to the driving chips and reducing the temperature difference of the entire display panel 100.

The plate bottom 330 includes a bead 360. The bead 360 may be a portion protruding from one surface of the plate bottom 330 toward the printed circuit board 340 and can improve the rigidity of the plate bottom 330 while supporting the printed circuit board 340. The bead 360 may come into direct contact with the printed circuit board 340, and the heat generated from the printed circuit board 340 may be distributed to the entirety of the plate bottom 330 through the bead 360.

Although not illustrated in the drawing, the plate bottom 330 includes a fastening part (not illustrated). The fastening part (not illustrated) is a part to which fasteners (not illustrated) passing through a first fastening hole (not illustrated) of the printed circuit board 300 and a second fastening hole (not illustrated) of the cover shield 370 are coupled. The fastener (not illustrated) may be coupled to the fastening part to mutually fix the plate bottom 330, the printed circuit board 340, and the cover shield 370.

The cover shield 370 is disposed on the cover bottom 200, the plate bottom 330, and the printed circuit board 340. The cover shield 370 may protect the printed circuit board 340 from an external impact. The cover shield 370 may be made of a rigid material to protect the printed circuit board 340, but is not limited thereto.

The cover shield 370 may be disposed on the rear surface of the cover bottom 200 to cover the printed circuit board 340.

Figure 9:
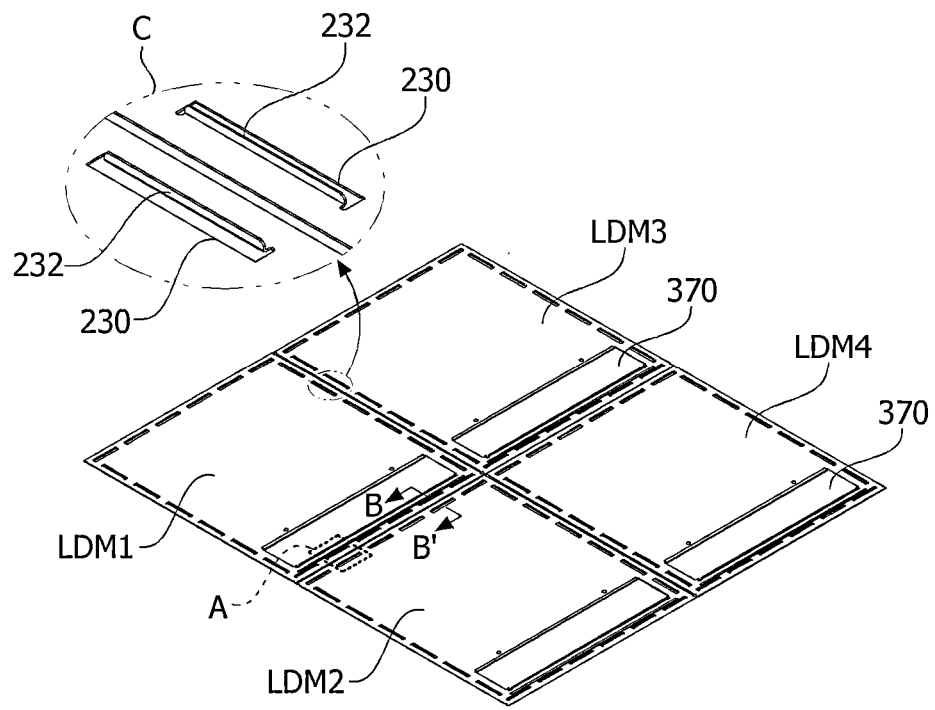
FIG. 9 is a perspective view illustrating a state in which a plurality of display modules are disposed adjacent to each other according to one embodiment of the present specification.
Figure 10:
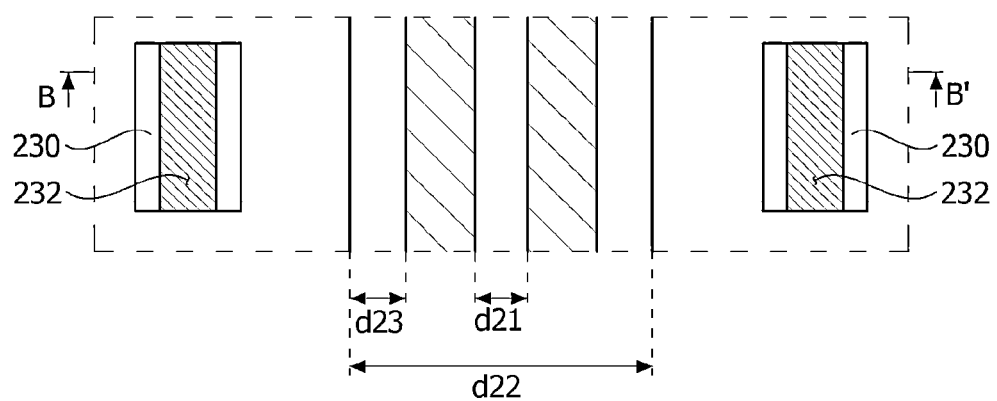
FIG. 10 is a partial enlarged view of portion A in FIG. 9 according to one embodiment of the present specification.
Figure 11:
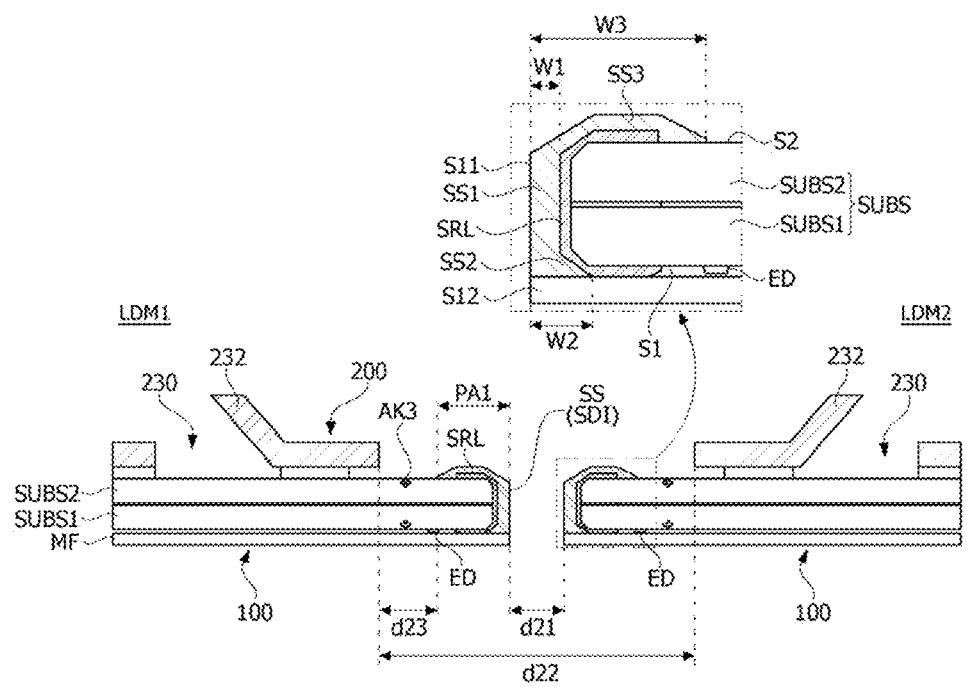
FIG. 11 is a cross-sectional view along line B-B' in FIG. 9 according to one embodiment of the present specification.

FIG. 9 is a perspective view illustrating a state in which a plurality of display modules are disposed adjacent to each other according to one embodiment. FIG. 10 is an enlarged view of portion A in FIG. 9 according to one embodiment. FIG. 11 is a cross-sectional view along line B-B' in FIG. 9 according to one embodiment.

Referring to FIGS. 9 to 11, a plurality of display modules LDM1, LDM2, LDM3, and LDM4 may be coupled on the same plane to be implemented as a large-screen tiling display device. The display modules LDM1, LDM2, LDM3, and LDM4 may be detachably coupled by a module bracket and a rail frame, which will be described below.

Although FIG. 9 illustrates an example in which four display modules LDM1, LDM2, LDM3, and LDM4 are coupled, the number of display modules is not particularly limited.

Referring to FIGS. 10 and 11, in the tiling display device, a first separation distance d21 between the adjacent display modules LDM1 to LDM4 may be in a range of 1 µm to 200 µm. When the separation distance is satisfied, an interference problem due to tolerance or thermal deformation can be solved, and thus a seam area may be invisible. However, the first separation distance d21 is not necessarily limited thereto and may be adjusted in various ways depending on a structure or size of the display panel.

As described above, the first pad electrode may be disposed on an outermost portion of one surface S1 of the display panel 100, and the second pad electrode may be disposed on an outermost portion of the other surface S2. The first pad electrode and the second pad electrode may be electrically connected by the side line SRL. The seal SS may be formed on the side line SRL. The seal SS may include black ink or an organic/inorganic material layer.

The functional film MF attached to the substrate SUBS may have a side surface parallel to a side surface of the seal SS. In other words, a side surface S12 of the functional film MF and a side surface S11 of the seal SS may be disposed on the same plane. Therefore, the first separation distance d21 between the seals SS in the two adjacent display modules LDM1 and LDM2 may be the same as the separation distance d21 between the functional films MF.

The seal SS may include a first area SS1 formed on the side surface of the substrate SUBS, a second area SS2 extending to the one surface S1 of the substrate SUBS, and a third area SS3 connected to the other surface S2 of the substrate SUBS. In this case, a width W3 of the third area SS3 may be larger than a width W2 of the second area SS2. The second area S22 may not cover a portion of the side line SRL formed on the one surface of the substrate SUBS. This is because the seal SS is formed after the functional film MF is attached to the one surface of the substrate SUBS on which the side line SRL is formed. The third area SS3 of the seal SS may be formed to be sufficiently large to cover the side lines SRL exposed on the other surface of the substrate SUBS.

An area of the cover bottom 200 may be smaller than an area of the display panel 100. Therefore, the cover bottom 200 may not cover the seal SS formed on the side surface of the display panel 100. The cover bottom 200 may be spaced a predetermined distance from the seal SS. This is because interference with the adjacent display modules LDM1 and LDM2 may occur upon the occurrence of an assembly tolerance or the like when the cover bottom 200 is designed to have the same area as that of the display panel 100.

Therefore, a second separation distance d22 at which the cover bottom 200 is spaced apart from the adjacent display modules LDM1 and LDM2 may be larger than the first separation distance d21 at which the seal SS is spaced apart from the adjacent display modules LDM1 and LDM2.

With this configuration, the cover bottom 200 may expose an alignment key AK3 for arranging the display panel 100 at the correct position on a jig. Therefore, the alignment key AK3 may be disposed in a separation space S23 between the cover bottom 200 and the seal SS.

However, the present specification is not necessarily limited thereto, and the cover bottom 200 may extend to cover the seal SS. In this case, a hole for exposing the alignment key AK3 may be formed in the cover bottom 200.

The cover bottom 200 may include a plurality of protruding portions 232 to be coupled to the module bracket 400. The protruding portion 232 may be formed by cutting and then bending a portion of the cover bottom 200. Therefore, the protruding portion 232 may be formed to be inclined at a predetermined angle at one side of the opening 230 formed by cutting the cover bottom 200. In particular, the protruding portion 232 may be formed by being bent in a shape inclined toward a center of the cover bottom 200 to be coupled to the module bracket 400. However, the present specification is not necessarily limited thereto, and a separate protruding portion may be coupled to the cover bottom 200. In other words, various known methods can be applied to form the protruding portion 232.

Figure 12:
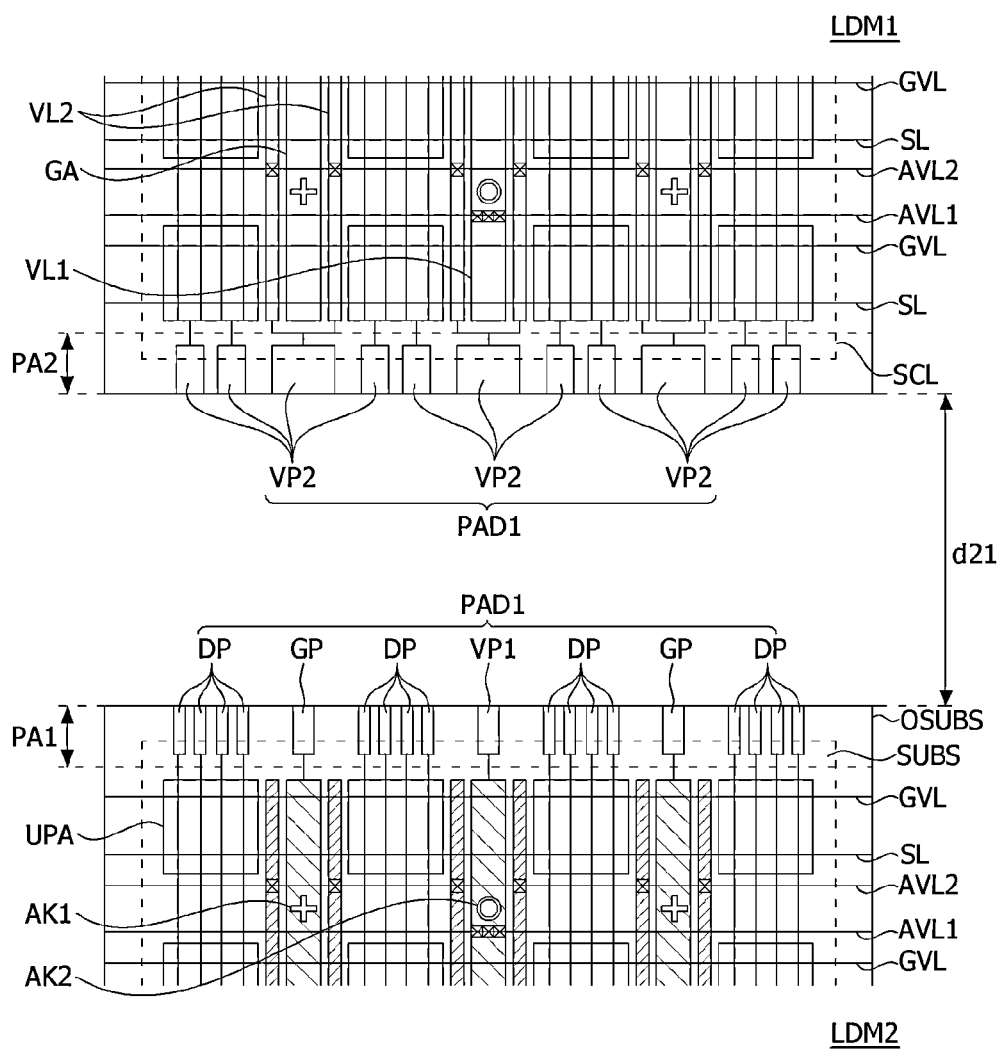
FIG. 12 is a view illustrating shapes of electrode pads disposed on display panels of the adjacent display modules according to one embodiment of the present specification.

FIG. 12 is a view illustrating shapes of electrode pads disposed on the display panels of adjacent display modules.

Referring to FIG. 12, the plurality of display modules may be sequentially disposed in the X-axis and Y-axis directions. Therefore, shapes of pads in areas in which adjacent first display modules LDM1 and second display modules LDM2 face each other may be different. As described with reference to FIG. 5, the power pads VP1 and VP2 of the display panel 100 may include the plurality of high-potential power pads VP1 disposed on the first pad area PA1 and the plurality of low-potential power pads VP2 disposed on the second pad area PA2. The data pad DP and the gate pad GP may be further disposed on the first pad area PA1.

The data pad DP and the gate pad GP may have relatively smaller widths, and the power pads VP1 and VP2 may have relatively larger widths. In addition, the low-potential power pads VP2 may have larger widths than the high-potential power pads VP1.

Therefore, since the low-potential power pads VP2 disposed on the second pad area PA2 of the first display module LDM1 are disposed to face the high-potential power pads VP1 disposed on the first pad area PA1 of the second display module LDM2, a width of the electrode pad PAD1 disposed on the side surface of the first display module LDM1 may be larger than a width of the electrode pad PAD1 disposed on the side surface of the facing second display module LDM2.

Figure 13:
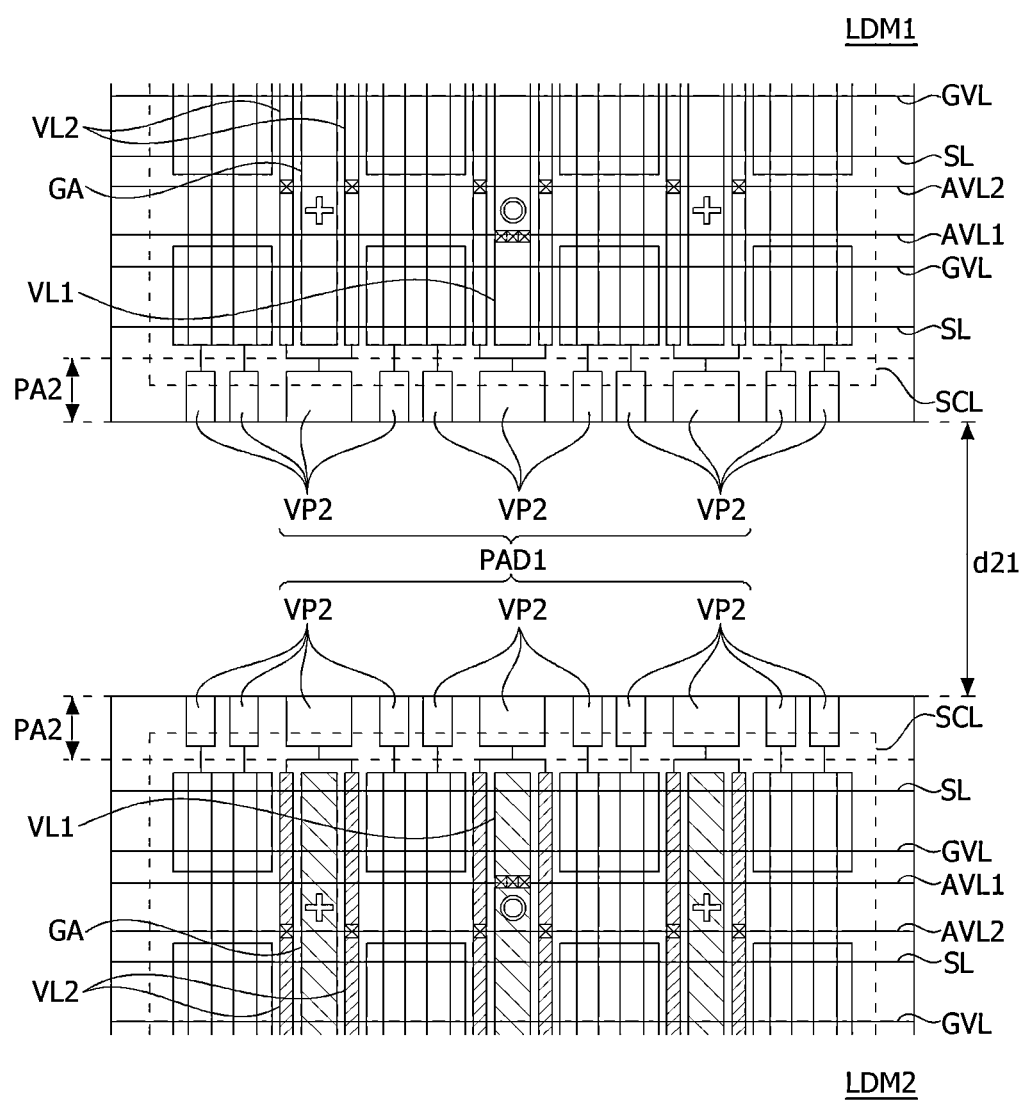
FIG. 13 is a view illustrating a first modified example of the electrode pads of FIG. 12 according to one embodiment of the present specification.
Figure 14:
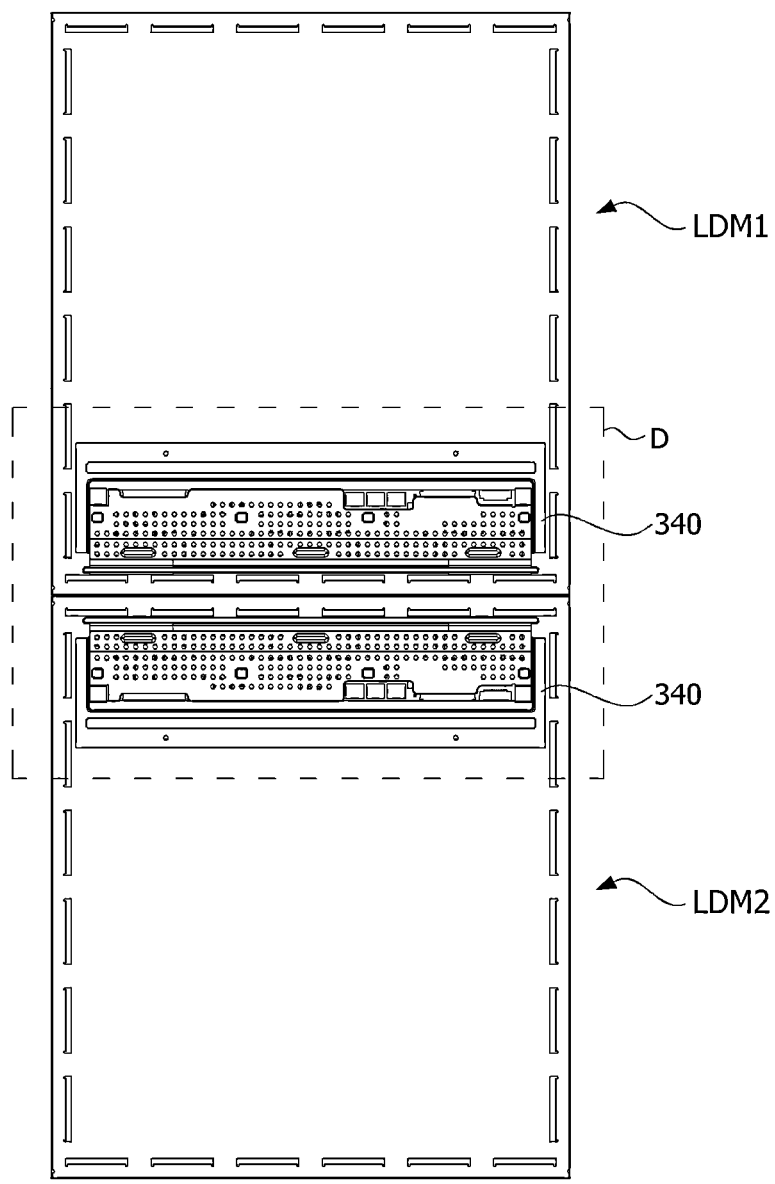
FIG. 14 is a view illustrating a state in which two display modules are disposed adjacent to each other according to FIG. 13 according to one embodiment of the present specification.

FIG. 13 is a view illustrating a first modified example of the electrode pads of FIG. 12 according to one embodiment. FIG. 14 is a view illustrating a state in which two display modules are disposed according to FIG. 13 according to one embodiment.

Referring to FIGS. 13 and 14, the width of the electrode pad PAD1 disposed on the side surface of the first display module LDM1 may be the same as the width of the electrode pad PAD1 disposed on the side surface of the second display module LDM2. In this case, the circuit boards 340 of the first and second display modules LDM1 and LDM2 may be disposed adjacent to each other.

With this arrangement, it is possible to increase heat dissipation efficiency by arranging the circuit boards 340 from which more heat is generated, to face each other and forming a heat dissipation structure in the high heat source area D on which heat is concentrated.

Figure 15:
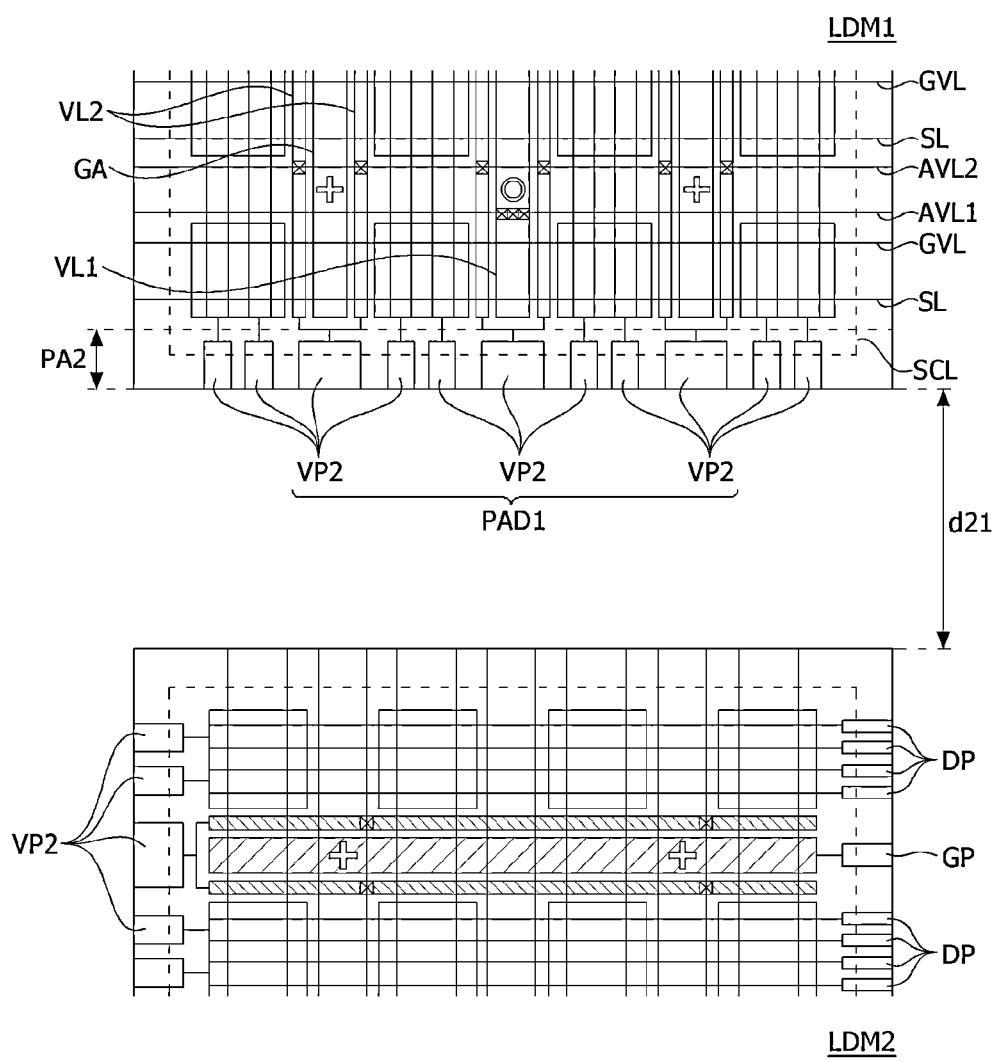
FIG. 15 is a view illustrating a second modified example of the electrode pads of FIG. 12 according to one embodiment of the present specification.
Figure 16:
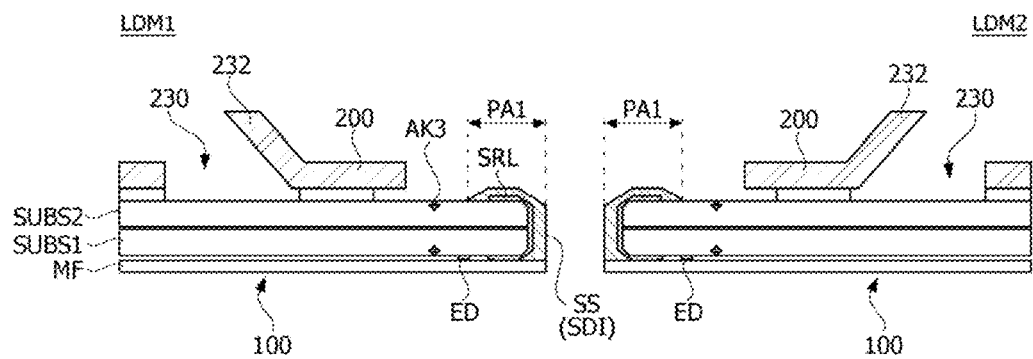
FIG. 16 is a view illustrating a cross-sectional structure of the two adjacent display modules according to one embodiment of the present specification.

FIG. 15 is a view illustrating a second modified example of the electrode pads of FIG. 12 according to one embodiment. FIG. 16 is a view illustrating a cross-sectional structure of two display modules based on the electrode pads of FIG. 15 according to one embodiment.

Referring to FIGS. 15 and 16, the electrode pad PAD1 is formed on the side surface of the first display module LDM1, while the electrode pad may not be formed on the side surface of the facing second display module LDM2. Therefore, the side line SRL is formed on the side surface of the first display module LDM1, while the side wire may not be formed on the side surface of the facing second display module LDM2. According to the embodiment, since the plurality of display modules are manufactured by being tiled, the display modules may be coupled by being rotated in different directions due to various issues (light uniformity and the like).

Figure 17:
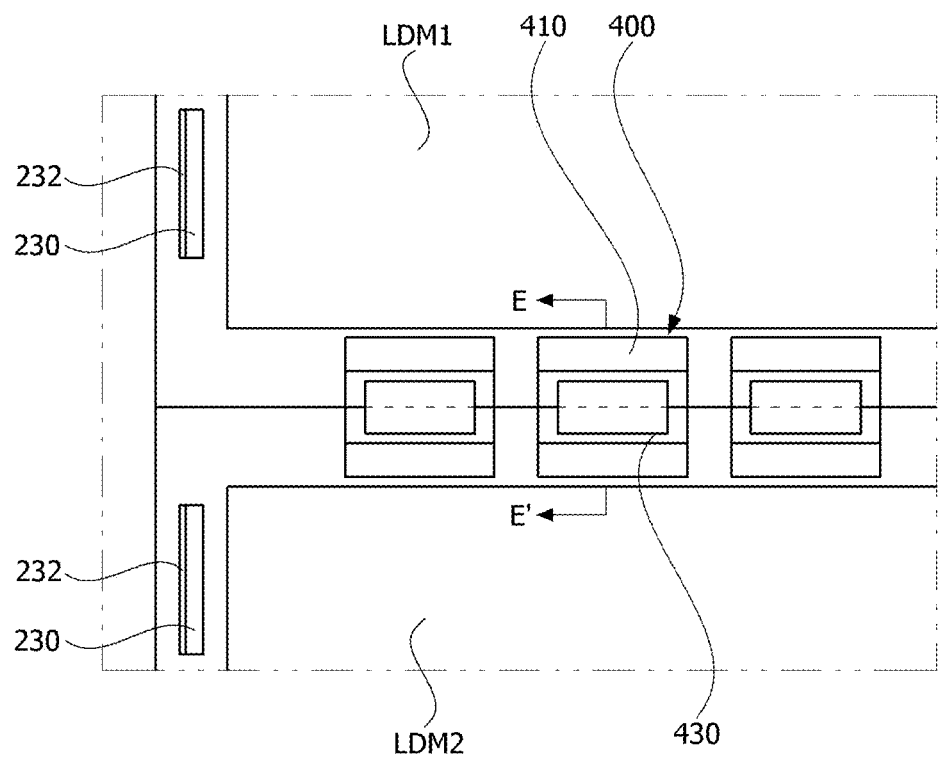
FIG. 17 is a plan view illustrating a state in which the adjacent display modules are coupled by module brackets according to one embodiment of the present specification.
Figure 18:
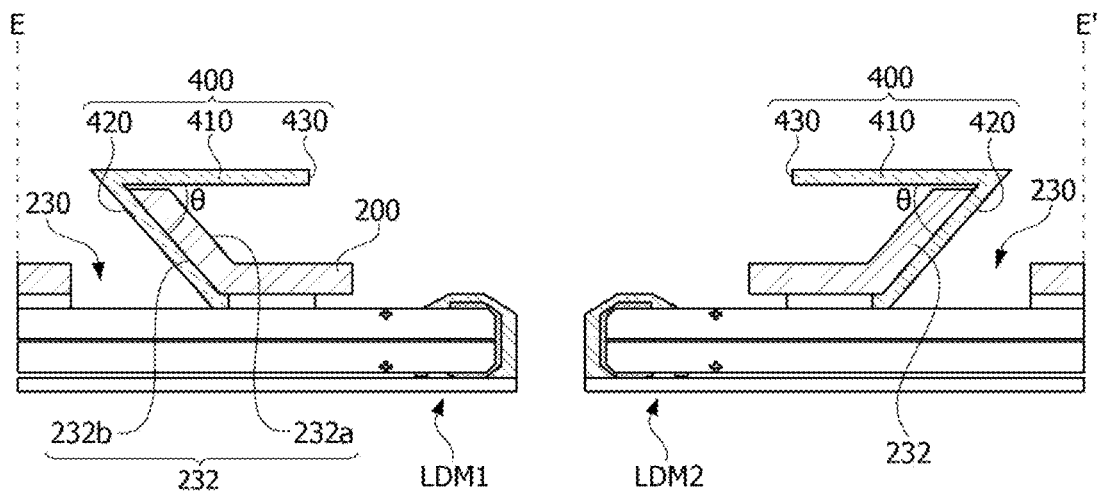
FIG. 18 is a cross-sectional view along line E-E' in FIG. 17 according to one embodiment of the present specification.

FIG. 17 is a plan view illustrating a state in which the adjacent display modules are coupled by module brackets according to one embodiment. FIG. 18 is a cross-sectional view along line E-E' in FIG. 17 according to one embodiment.

Referring to FIGS. 17 and 18, the display modules LDM1 and LDM2 may be disposed to be spaced a predetermined distance from each other in a state of being coupled to the module bracket 400. When the plurality of display modules are fixed to the module bracket 400 without any gap, there may be a problem in which the boundaries of the plurality of display modules are visible when a step due to an assembly tolerance occurs. Therefore, the plurality of display modules LDM1 and LDM2 disposed adjacent to each other to form the integrated tiling display device may be spaced a predetermined distance from each other.

The plurality of openings 230 of the cover bottom 200 are formed along an edge portion of the cover bottom 200. The plurality of openings 230 may be formed parallel to the edge portion of the cover bottom 200. The plurality of openings 230 are openings formed together with the plurality of protruding portions 232.

Since the protruding portion 232 formed on and bent from the rear surface of the cover bottom 200 coupled to each of the display modules LDM1 and LDM2 is coupled by being inserted in close contact with inner surfaces of both side surface portions 420 of the module bracket 400, the adjacent display modules LDM1 and LDM2 are fixedly coupled by the module bracket 400 without separation.

Therefore, the plurality of display modules LDM1 and LDM2 may form the tiling display device by the plurality of module brackets 400, a boundary area formed by the plurality of adjacent display modules LDM1 and LDM2, a plurality of magnets, which will be described below, between the module brackets 400 and in the module brackets 400, and the rail frame, which will be described below, disposed on the module brackets 400.

In addition, the module bracket 400 may include an upper flat portion 410 in contact with the rail frame which is omitted in the drawing, a side surface portion 420 bent inward from both sides of the upper flat portion 410, and an opening 430 that a support magnet 530 is inserted and protrudes.

In addition, since the protruding portions 232 of the cover bottom 200 of each of the adjacent display modules LDM1 and LDM2 are inserted into both side surface portions 420 of the module bracket 400 so that the protruding portions 232 are fixedly coupled in close contact with the inner surfaces of the both side surface portions 420, the adjacent display modules LDM1 and LDM2 are fixedly coupled by the module brackets 400.

In this case, since the both side surface portions 420 of the module bracket 400 are configured in a shape which is bent inward at a predetermined angle θ, when the protruding portions 232 of the cover bottom 200 are coupled in close contact with the inner surfaces of the side surface portions 420, the side surface portions 420 are slightly pushed outward by the protruding portions 232, and at the same time, a repulsive force acts inward due to a reaction, and as a result, the protruding portions 232 may not be easily separated from and may be firmly and fixedly coupled to the side surface portions 420 of the module bracket 400.

Figure 19:
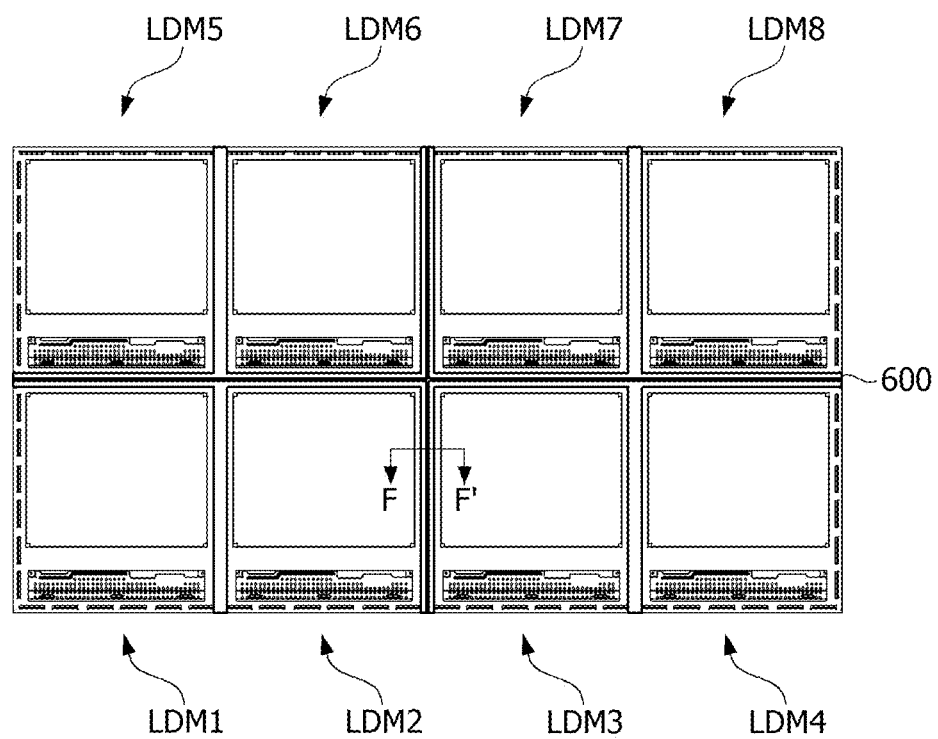
FIG. 19 is a plan view illustrating a state in which a rail frame is disposed along boundary portions of the plurality of adjacent display modules of the display device according to one embodiment of the present specification.

FIG. 19 is a plan view illustrating a state in which a rail frame is disposed along boundary portions of the plurality of adjacent display modules included in the display device according to the one embodiment of the present specification.

Figure 20:
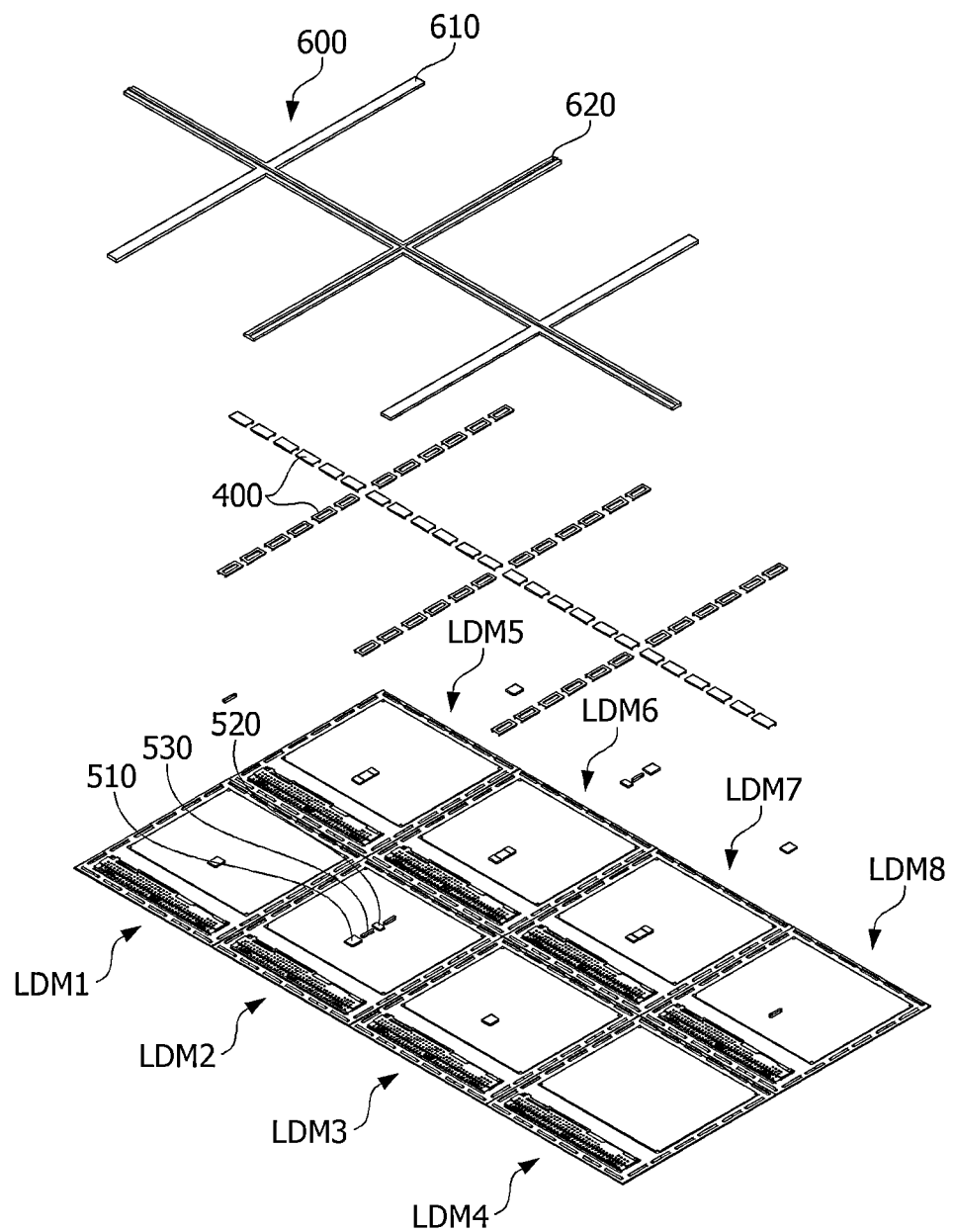
FIG. 20 is an exploded perspective view illustrating a state in which the plurality of display modules, a plurality of module brackets, a plurality of magnets, and the rail frame are separated according to one embodiment of the present specification.

FIG. 20 is an exploded perspective view illustrating a state in which the plurality of display modules, a plurality of module brackets, a plurality of magnets, and the rail frame of the display device are separated according to the one embodiment of the present specification.

Referring to FIGS. 19 and 20, the display device according to the one embodiment of the present invention may include a plurality of display modules LDM1, LDM2, LDM3, LDM4, LDM5, LDM6, LDM7, and LDM8 each having a screen on which images are displayed on a front surface thereof, the plurality of module brackets 400 connecting the plurality of display modules LDM1 to LMD8 in contact with each other, a plurality of magnets 510, 520, and 530 disposed on boundary areas between the plurality of display modules LDM1 to LDM8 in contact with each other, and the rail frame 600 disposed on the plurality of module brackets 400 including the boundary areas formed by the plurality of adjacent display modules LDM1 to LDM8 and the plurality of main magnets 510, sub-magnets 520, and support magnets 530.

Each of the plurality of display modules LDM1, LDM2, LDM3, LDM4, LDM5, LDM6, LDM7, and LDM8 is disposed in the form of N×M (N is a positive integer of 2 or more, and M is a positive integer of 2 or more) to display individual images or divide one image and display the divided image. Here, although a case in which the plurality of display modules LDM1, LDM2, LDM3, LDM4, LDM5, LDM6, LDM7, and LDM8 are disposed in the form of 4×2 is described as an example, the present invention is not limited thereto and can be applied to various embodiments.

Each of the plurality of display modules LDM1, LDM2, LDM3, LDM4, LDM5, LDM6, LDM7, and LDM8 includes the display module according to the present specification illustrated in FIGS. 1 to 6, and overlapping description thereof will be omitted.

The protruding portions 232 provided on the cover bottom 200 coupled to the rear surface of each of the plurality of adjacent display modules LDM1 to LDM8 are fixedly coupled to the side surface portions 420 by being inserted in close contact with the inner surfaces of the side surface portions 420 of the module bracket 400.

The main magnet 510 having magnetism is disposed on the boundary area on which the plurality of adjacent display modules LDM1 to LDM8 are disposed.

The plurality of main magnets 510 are disposed on the boundary areas on which the plurality of adjacent display modules LDM1 to LDM8 are disposed.

In this case, although the plurality of main magnets 510 do not need to be disposed on each boundary area on which the plurality of adjacent display modules LDM1 to LDM8 are disposed, a large number of main magnets 510 may be disposed on boundary areas between adjacent display modules with relatively greater thermal deformation. This is because, when a large number of main magnets 510 are disposed on a boundary area with relatively greater warpage of the display module due to thermal expansion, heat may be effectively discharged to the outside through the rail frame 600 in contact with an upper portion of the main magnet 510 through the main magnet 510, thereby minimizing or at least reducing the warpage phenomenon of the display module due to the thermal expansion and a step difference between the adjacent display modules.

In addition, the plurality of sub-magnets 520 are disposed between the plurality of module brackets 400 into which the plurality of protruding portions 232 provided on the cover bottom 200 coupled to the rear surface of each of the plurality of adjacent display modules LDM1 to LDM8 are fixedly inserted.

In this case, although the sub-magnet 520 does not need to be disposed between each pair of the plurality of adjacent module brackets 400, like the main magnet 510, a larger number of sub-magnets 520 may be disposed on areas in which more thermal deformation occurs than areas in which less thermal deformation occurs. This is because, when a large number of sub-magnets 520 are disposed on an area in which more warpage occurs, heat may be effectively discharged to the outside through the rail frame 600 in contact with an upper portion of the sub-magnet 520 through the sub-magnet 520, thereby minimizing or at least reducing the warpage of the display module due to the thermal expansion and the step difference between the display modules.

Figure 21:
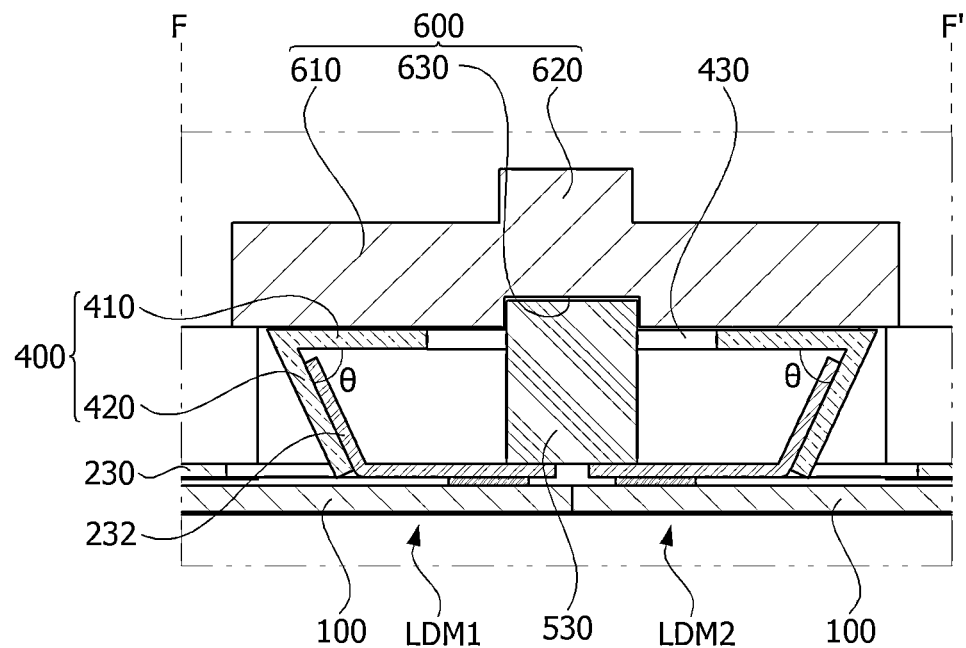
FIG. 21 is a cross-sectional view along line F-F' in FIG. 19 according to one embodiment of the present specification.

FIG. 21 is a cross-sectional view along line F-F' in FIG. 19 according to one embodiment.

Figure 22:
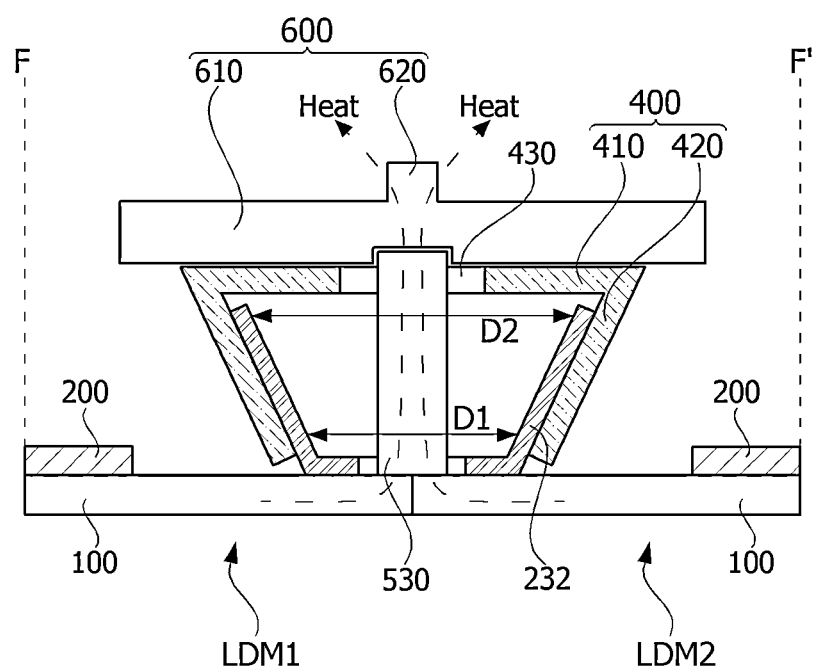
FIG. 22 is a cross-sectional view schematically illustrating a heat transfer path in which heat generated from the display module is discharged to the outside through a support magnet and the rail frame according to one embodiment of the present specification.

FIG. 22 is a cross-sectional view schematically illustrating a state in which heat generated from the display module moves to the outside through the support magnet and the rail frame according to one embodiment.

Referring to FIGS. 21 and 22, the module bracket 400 may be fastened to the protruding portions 232 of the adjacent display modules LDM1 and LDM2 in the form of surrounding the protruding portions 232 of each of the adjacent display modules LDM1 and LDM2 to couple the adjacent display modules LDM1 and LDM2.

The module bracket 400 includes the upper flat portion 410 and the side surface portion 420 bent to both sides of the upper flat portion 410, and an opening 430 is formed so that the support magnet 530 is inserted into the upper flat portion 410 and protrudes upward from the upper flat portion 410 by a predetermined height.

The module bracket 400 includes the upper flat portion 410 having the opening 430 through which the support magnet 530 passes, and the side surface portions 420 bent from both sides of the upper flat portion 410.

A distance between the side surface portions 420 may decrease toward the rear surfaces of the display modules LDM1 and LDM2 to surround the protruding portions 232 facing each other in the adjacent display modules LDM1 and LDM2.

In particular, the side surface portions 420 of the module bracket 400 may be configured in a shape which is bent at a predetermined angle θ, for example, about 30 degrees to 70 degrees to surround the protruding portions 232.

In addition, a distance between the facing protruding portions 232 in the adjacent display modules LDM1 and LDM2 may be formed to have an upper side distance D2 larger than a lower side distance D1. In other words, the distance between the facing protruding portions 232 in the adjacent display modules LDM1 and LDM2 may be formed to be larger toward the upper flat portion 410 of the module bracket 400.

The module bracket 400 may be fastened in a sliding manner in directions of the side surfaces of the protruding portions 232 of the adjacent display modules LDM1 and LDM2. It is possible to easily couple and separate the plurality of display modules by such a fastening structure.

The rail frame 600 for fixedly coupling the plurality of display modules LDM1 to LDM8 by the plurality of magnets 510, 520, and 530 is disposed on an upper surface of the module bracket 400.

The rail frame 600 may include a plurality of body portion 610 extending in horizontal and vertical directions to be disposed on the boundary areas of the adjacent display modules LDM1 to LDM8, and a reinforcement portion 620 protruding from an upper surface of the body portion 610 to reinforce rigidity. A lower surface of the body portion 610 of the rail frame 600 may have an insertion groove 630 formed in a longitudinal direction of the body portion 610 so that the support magnet 530 is inserted therein.

The support magnet 530 may be disposed to protrude upward from the upper flat portion 410 of the module bracket 400 to be supported in a state of being inserted into the insertion groove 630.

The plurality of support magnets 530 may be disposed in the plurality of module brackets 400 connecting the adjacent display modules LDM1 to LDM8.

In this case, although the support magnet 530 does not need to be disposed on each of the plurality of adjacent module brackets 400, like the main magnet 510, a larger number of support magnets 530 may be disposed on areas in which more thermal deformation occurs than areas in which less thermal deformation occurs.

Referring to FIG. 22, when a large number of support magnets 530 are disposed on the area in which more warpage occurs, heat can be effectively discharged to the outside through the rail frame 600 in contact with the upper portion of the support magnet 530 through the support magnet 530, thereby minimizing the warpage phenomenon.

Figure 23:
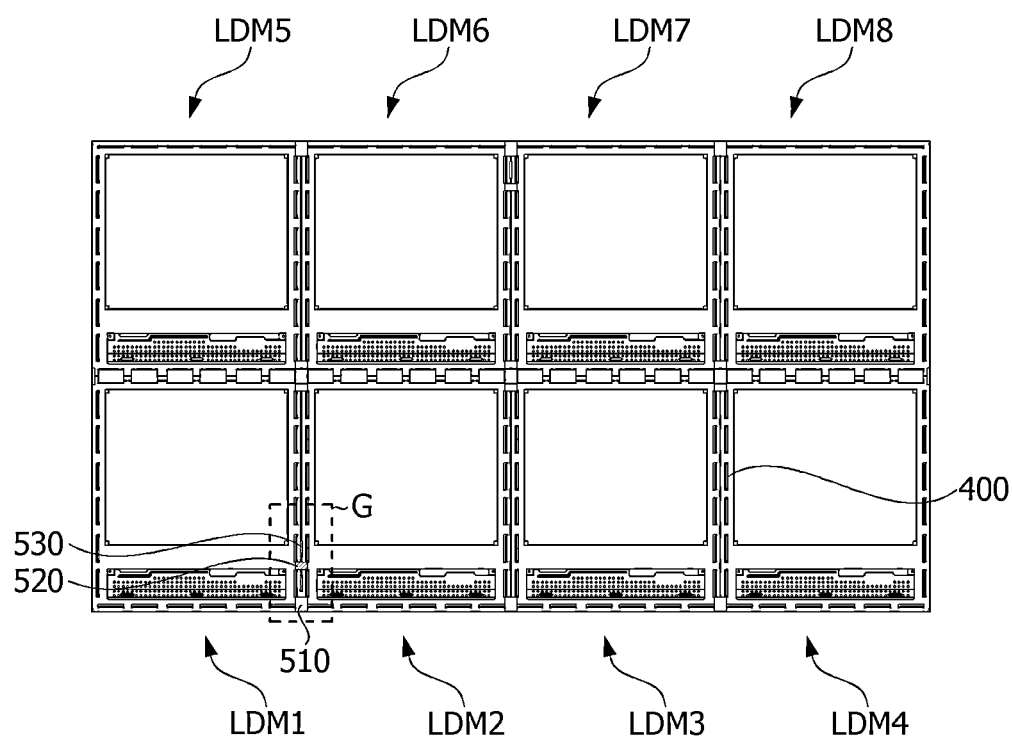
FIG. 23 is a plan view illustrating the plurality of magnets disposed on the plurality of module brackets coupling the plurality of adjacent display modules, between the module brackets, and inside the module brackets according to one embodiment of the present specification.
Figure 24:
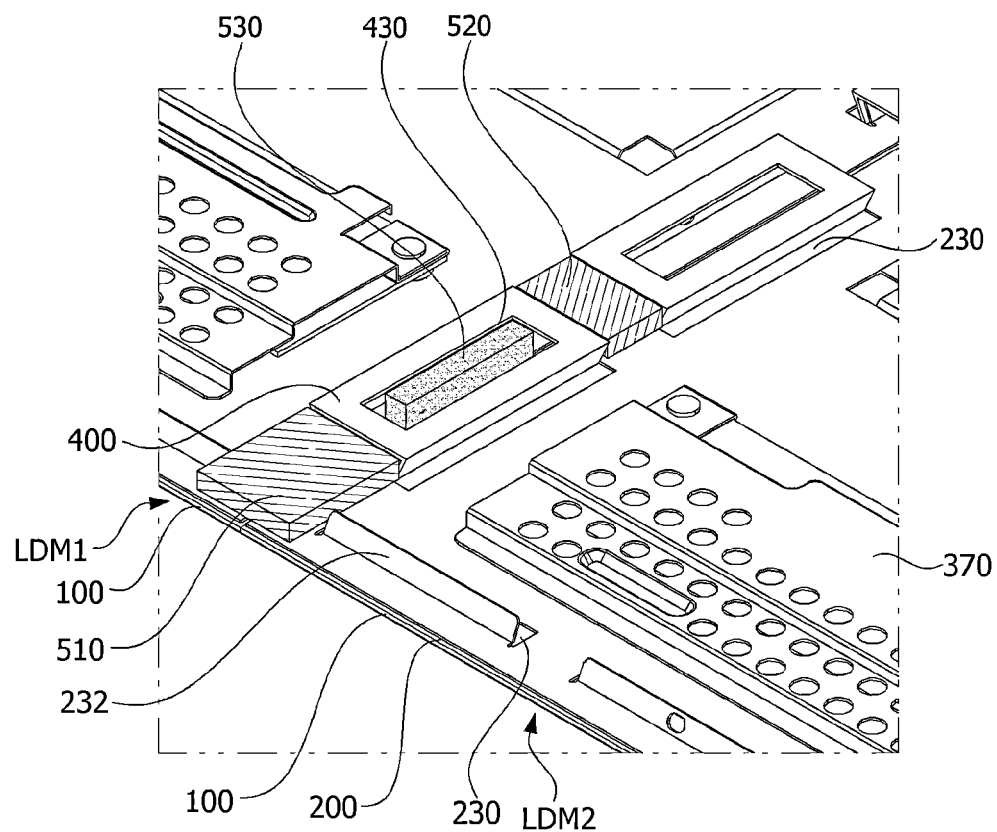
FIG. 24 is an enlarged perspective view of portion G in FIG. 23 according to one embodiment of the present specification.

FIG. 23 is a plan view illustrating the plurality of magnets disposed on the plurality of module brackets coupling the plurality of adjacent display modules, between the module brackets, and inside the module brackets of the display device according to the one embodiment of the present specification. FIG. 24 is an enlarged perspective view of portion G in FIG. 23 according to the one embodiment of the present specification.

Figure 25:
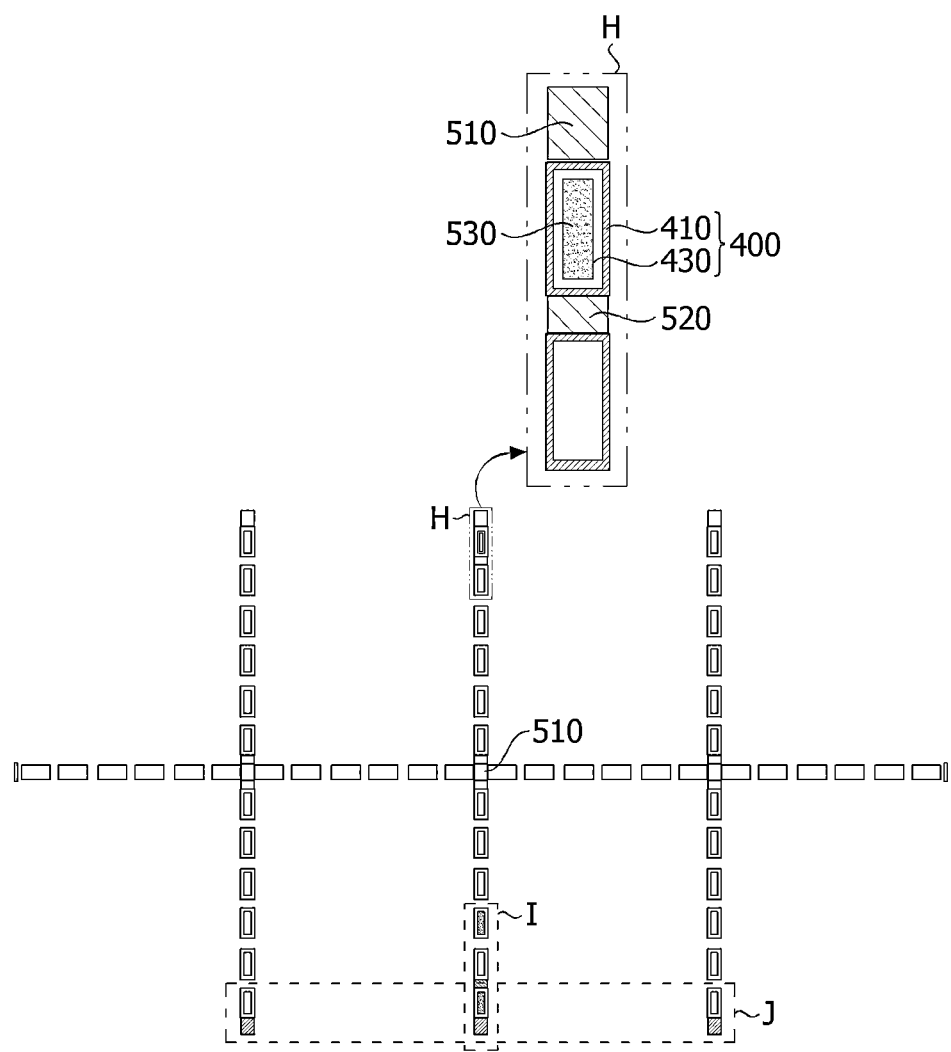
FIG. 25 is a schematic plan view illustrating the plurality of magnets disposed on the plurality of module brackets, between the brackets, and inside the brackets and a state in which a plurality of magnets are additionally disposed on an area in which more thermal deformation occurs according to one embodiment of the present specification.

FIG. 25 is a schematic plan view illustrating the plurality of magnets disposed on the plurality of module brackets, between the module brackets, and inside the module brackets according to the one embodiment of the present specification. Portion H of FIG. 25 is an enlarged plan view illustrating a state in which the main magnet, the sub-magnet, and the support magnet are disposed. Portions I and J of FIG. 25 are views illustrating a state in which the plurality of support magnets, sub-magnets, and main magnets are disposed on areas in which more thermal deformation occur.

Referring to FIGS. 23 and 24, the module bracket 400 is coupled to the outside of the protruding portion 232 of the cover bottom coupled to each of the plurality of adjacent display modules LDM1 to LDM8 to fixedly couple the plurality of display modules LDM1 to LDM8.

The main magnet 510 may be disposed on the boundary area of the adjacent display modules LDM1 and LDM2, the sub-magnet 520 may be disposed between the plurality of module brackets 400, and the support magnet 530 may be disposed in the plurality of module brackets 400.

The plurality of module brackets 400 are provided on the plurality of adjacent display modules LDM1 to LDM8 and coupled by being fastened to surround outer surfaces of the plurality of corresponding protruding portions 232.

The plurality of main magnets 510, sub-magnets 520, and support magnets 530 serve to basically fix the display to the rail frame to be described below when the display is replaced, connect the module brackets 400 to the rail frame, and minimize or at least reduce thermal deformation of the display modules using an attraction force.

As described above, the arrangement of the magnets may be changed in consideration of thermal deformation, and the moving arrangement along the rail frame 600 is possible.

Referring to FIG. 25, the main magnets 510 may be disposed on the boundary areas between the plurality of adjacent display modules LDM1 to LDM8. In this case, the main magnets 510 may be disposed on the boundary areas between the four adjacent display modules LDM1 to LDM4 or the boundary area between the two adjacent display modules LDM1 and LDM2.

In addition, a larger number of main magnets 510 may be disposed on the area in which more warpage occurs than the area in which less warpage occurs.

In addition, as in portions I and J of FIG. 25, a larger number of sub-magnets 520 may be disposed on the area in which more warpage occurs than the area in which less warpage occurs rather than the sub-magnets 520 being disposed between each pair of the plurality of module brackets 400.

A larger number of support magnets 530 may be disposed inside the plurality of module brackets 400 in the area in which more warpage occurs than the area in which less warpage occurs rather than the support magnet 530 being disposed on each of the plurality of module brackets 400.

Figure 26:
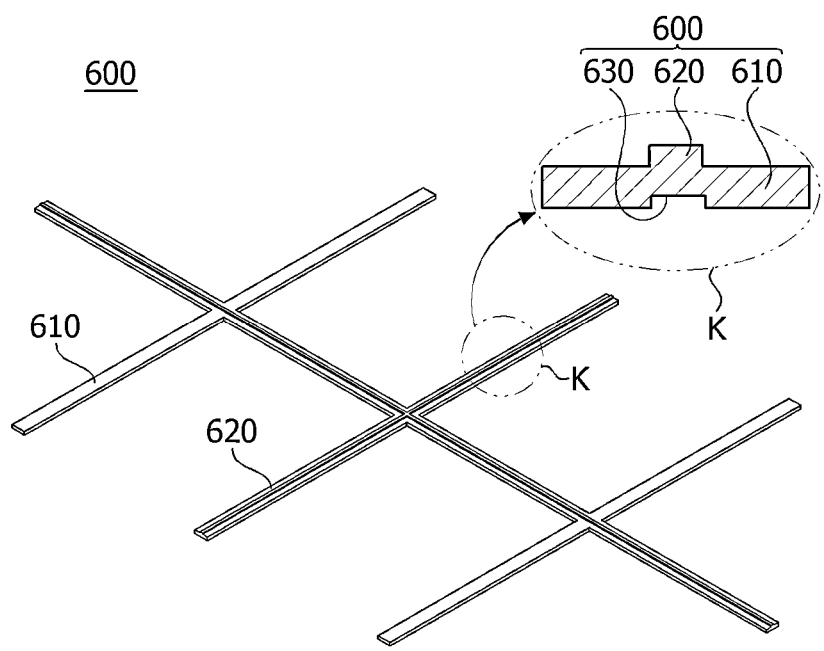
FIG. 26 is a top perspective view illustrating the rail frame in the display device according to one embodiment of the present specification.

FIG. 26 is a top perspective view illustrating the rail frame in the display device according to the one embodiment of the present specification. Portion K of FIG. 26 is an enlarged cross-sectional view illustrating a portion of the rail frame.

Figure 27:
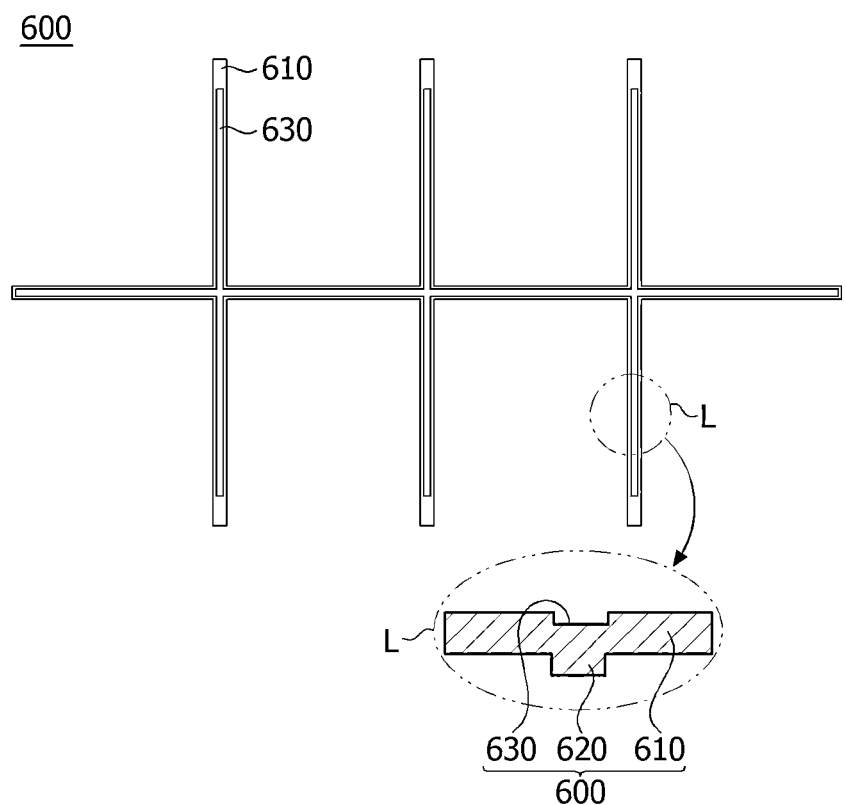
FIG. 27 is a bottom perspective view illustrating a rear surface of the rail frame in the display device according to one embodiment of the present specification.

FIG. 27 is a bottom perspective view illustrating a rear surface of the rail frame in the display device according to the one embodiment of the present specification. Portion L of FIG. 27 is an enlarged cross-sectional view illustrating a lower surface of the rail frame.

Figure 28:
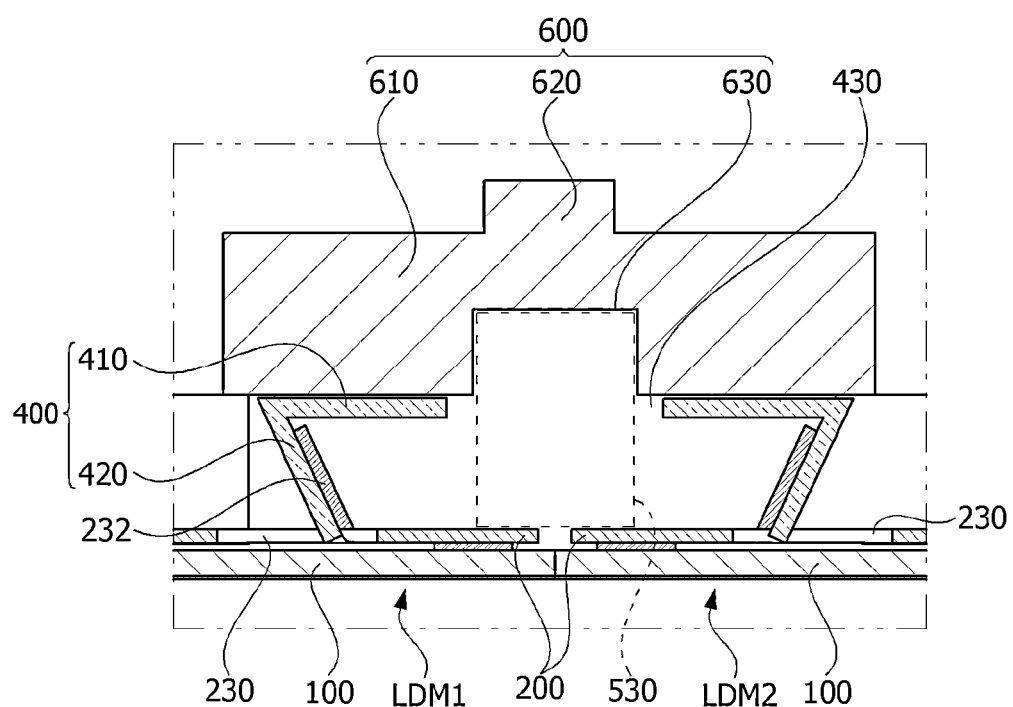
FIG. 28 is a coupling cross-sectional view illustrating the rail frame disposed above the module bracket in the display device according to one embodiment of the present specification.

FIG. 28 is a coupling cross-sectional view illustrating the rail frame disposed above the module bracket in the display device according to the one embodiment of the present specification.

Referring to FIGS. 26 and 27, the rail frame 600 may include the body portion 610 overlapping the boundary areas between the adjacent display modules LDM1 to LDM8, the reinforcement portion 620 protruding from the upper surface of the body portion 610 toward the rail frame 600 to increase rigidity, and the insertion groove 630 concavely recessed in the lower surface of the body portion 610.

The reinforcement portion 620 may be formed integrally with the upper surface of the body portion 610 in the longitudinal direction of the rail frame 600 to increase the rigidity of the rail frame 600.

The insertion groove 630 may be formed integrally with the lower surface of the body portion 610 in the longitudinal direction of the body portion 610.

The rail frame 600 may firmly fix each of the plurality of display modules LDM1 to LDM8 and serve as a heat pipe for discharging the heat generated from each display module to the outside.

In particular, in the rail frame 600, the reinforcement portion 620 needs to be formed on the body portion 610 to have rigidity in order to firmly and fixedly couple the plurality of display modules LDM1 to LDM8 by the module bracket 400 and the plurality of magnets 510, 520, and 530.

Referring to FIG. 28, the support magnet 530 disposed in the module bracket 400 through the opening 430 provided in the upper flat portion 410 of the module bracket 400 may be coupled by being inserted into the insertion groove 630 formed on the lower surface of the body portion 610 of the rail frame 600 in the protruded state.

Therefore, since the support magnet 530 is formed on the lower surface of the body portion 610 of the rail frame 600 in the longitudinal direction of the body portion 610, the arrangement of the support magnet 530 is easily changed in the module bracket 400 to be disposed among the plurality of module brackets 400 in consideration of thermal deformation.

Figure 29A:
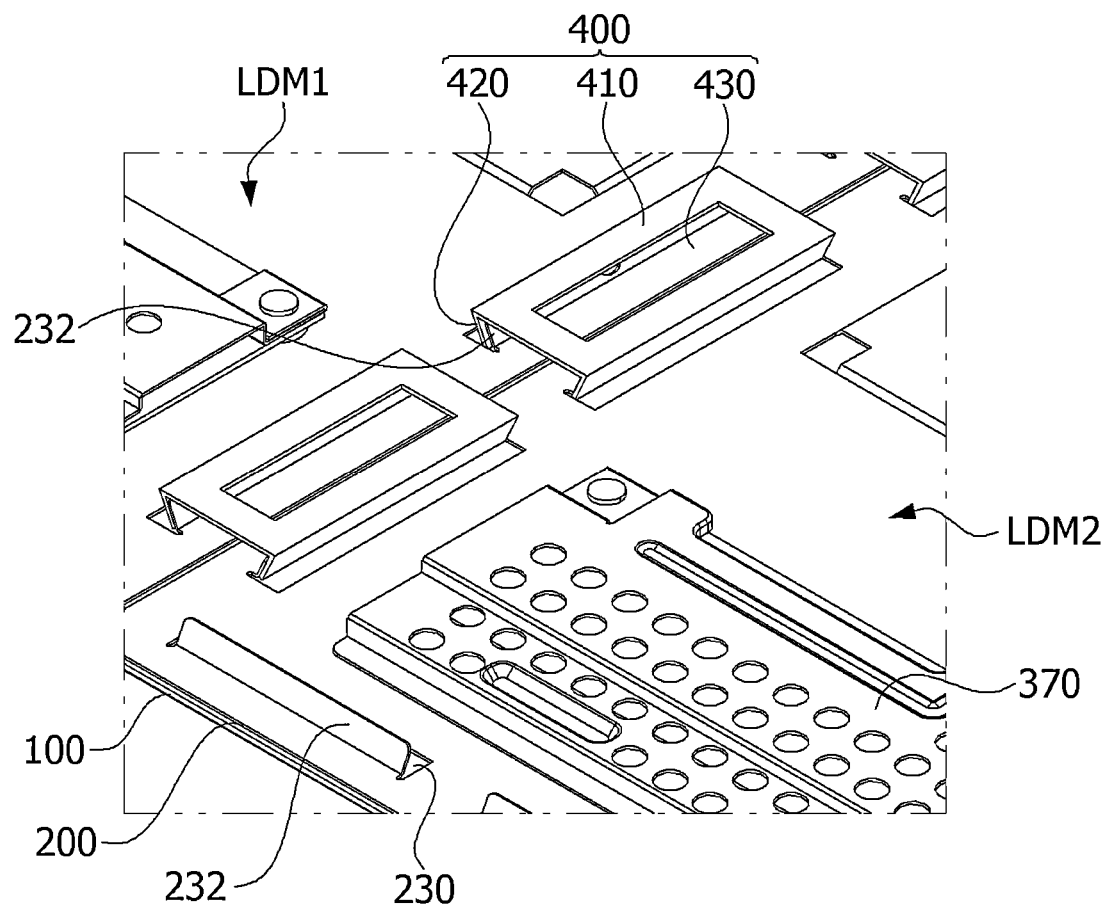
FIG. 29A is a perspective view illustrating an arrangement state of the module bracket coupling an additional display module disposed adjacently in the display device according to one embodiment of the present specification.

FIG. 29A is a perspective view illustrating an arrangement state of the module bracket coupling an additional display module disposed adjacently in the display device according to the one embodiment of the present specification.

Figure 29B:
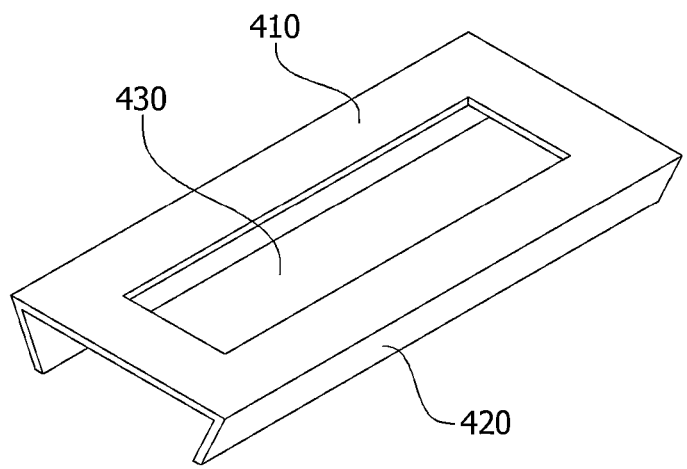
FIG. 29B is a perspective view illustrating the module bracket in the display device according to one embodiment of the present specification.

FIG. 29B is a perspective view illustrating the module bracket in the display device according to the one embodiment of the present specification.

Referring to FIGS. 29A and 29B, the module bracket 400 includes the upper flat portion 410 having the opening 430 through which the support magnet passes, and the side surface portions 420 bent from both sides of the upper flat portion 410.

A distance between the side surface portions 420 may decrease toward the rear surfaces of the display modules LDM1 and LDM2 to surround the protruding portions 232 facing each other in the adjacent display modules.

The module brackets 400 are fastened to surround the outer surfaces of the protruding portions 232 formed on the cover bottom 200 coupled to the rear surface of each of the plurality of adjacent display modules LDM1 and LDM2 using the side surface portions 420 to fixedly fix the plurality of adjacent display modules LDM1 and LDM2.

Therefore, the module bracket 400 serves to connect the plurality of display modules LDM1 to LDM8.

Since the module brackets 400 are fastened in a sliding manner in directions of the side surfaces of the protruding portions 232 of the adjacent display modules LDM1 and LDM2, it is possible to easily fasten and separate the plurality of display modules.

The opening 430 of the module bracket 400 has enough space in which the support magnet 530 may be inserted and may protrude. In other words, an area of the opening 430 may be formed larger than an area of the support magnet 530.

Figure 30A:
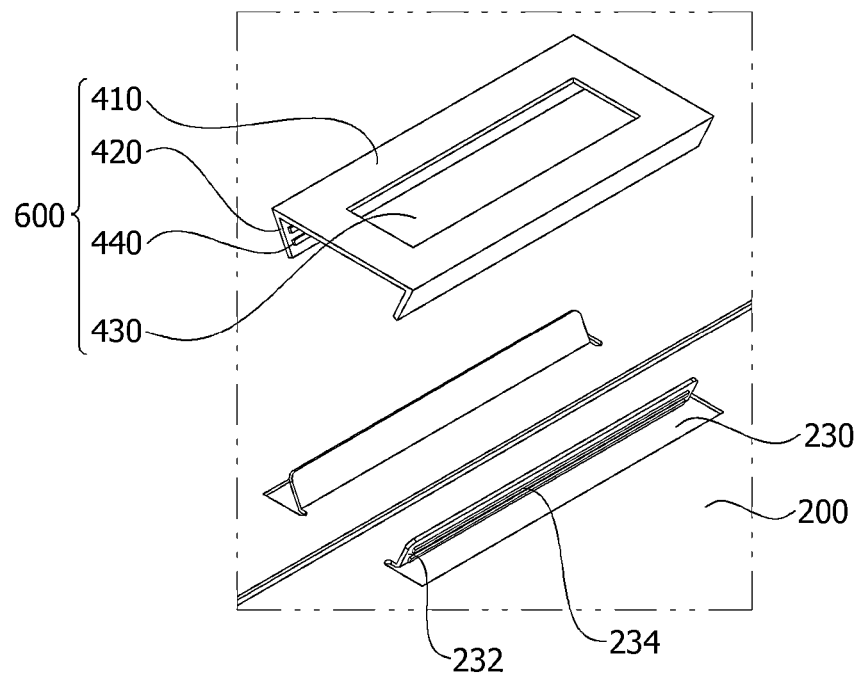
FIG. 30A is an exploded perspective view illustrating another form of each of the adjacent display modules, the module brackets connecting the plurality of display modules, and a protruding portion of a cover bottom coupled by being inserted into the module bracket as another embodiment of the present specification.

FIG. 30A is an exploded perspective view illustrating another form of each of the adjacent display modules, the module brackets connecting the plurality of display modules, and a protruding portion of a cover bottom coupled by being inserted into the module bracket as another embodiment of the present specification.

Figure 30B:
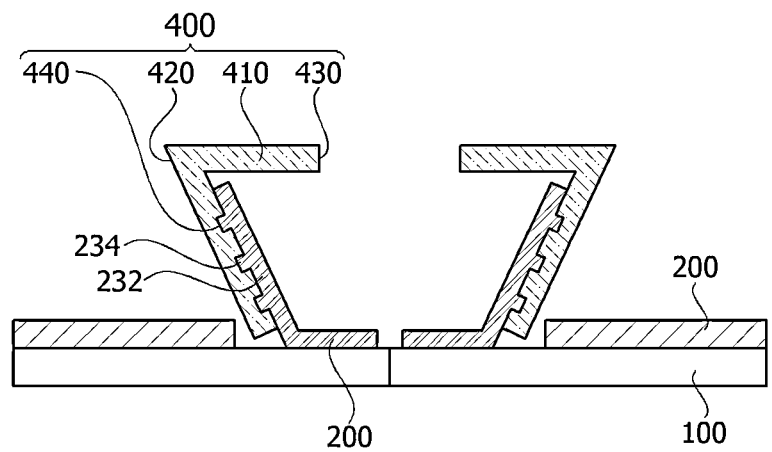
FIG. 30B is a coupling cross-sectional view illustrating a state in which locking protrusions of the protruding portions are coupled by being inserted into locking grooves formed in inner surfaces of side surface portions of the module brackets as another embodiment of the present specification.

FIG. 30B is a coupling cross-sectional view illustrating a state in which locking protrusions of the protruding portions are coupled by being inserted into locking grooves formed in inner surfaces of side surface portions of the module brackets as another embodiment of the present specification.

Referring to FIGS. 30A and 30B, the locking protrusions 234 may be formed on the outer surfaces of the protruding portions 232 formed on the cover bottom 200 coupled to the rear surface of each of the plurality of display modules LDM1 to LDM8 coupled in close contact with the side surface portions 420 of the module brackets 400 in a width direction at predetermined distances.

In addition, the locking grooves 440 may be formed at positions corresponding to the locking protrusions 234 on the inner surfaces of the side surface portions 420 of the module brackets 400 fastened in close contact with the protruding portions 232.

Therefore, since the locking protrusion 234 is caught in the locking groove 440 as the protruding portion 232 of the cover bottom 200 is fastened in close contact with the side surface portion 420 of the module bracket 400, the protruding portion 232 may not be separated from and may be firmly fastened to the module bracket 400.

Figure 31:
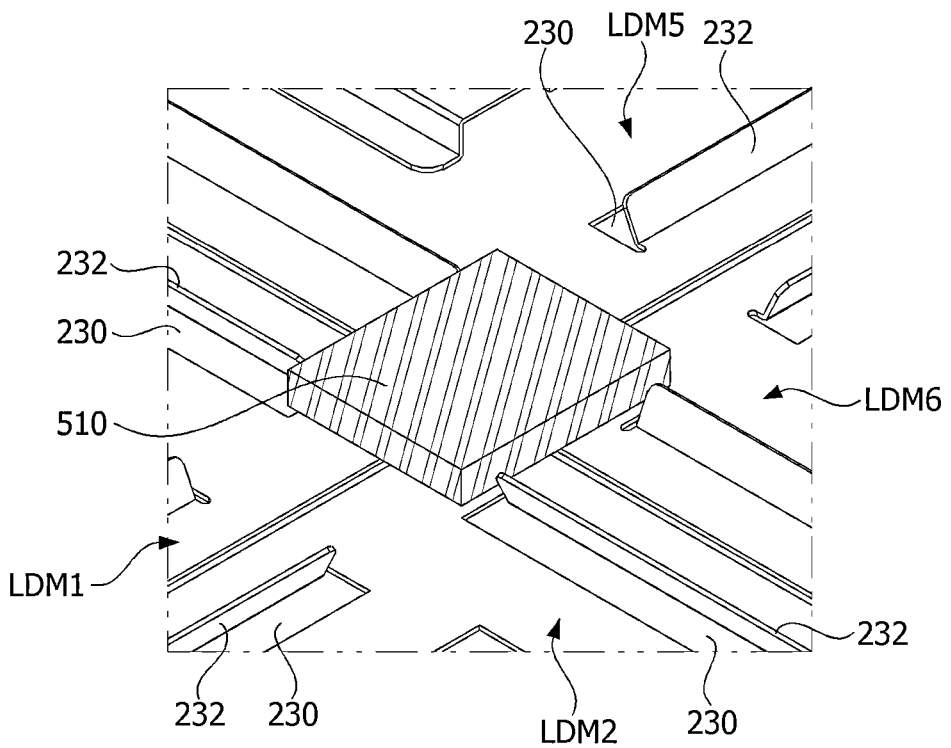
FIG. 31 is a perspective view illustrating a main magnet disposed on boundary areas of the plurality of adjacent display modules in the display device according to one embodiment of the present specification.

FIG. 31 is a perspective view illustrating a main magnet disposed on boundary areas of the plurality of adjacent display modules in the display device according to one embodiment of the present specification.

Figure 32:
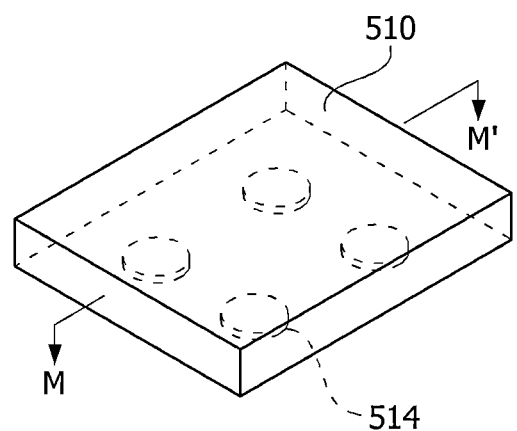
FIG. 32 is an enlarged perspective view of the main magnet according to one embodiment of present specification.

FIG. 32 is an enlarged perspective view of the main magnet according to one embodiment of the present specification.

Figure 33:
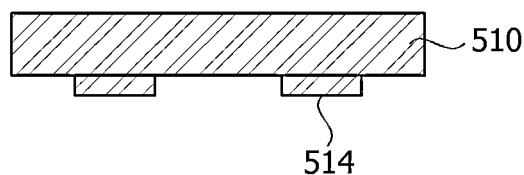
FIG. 33 is a cross-sectional view along line M-M' in FIG. 32 according to one embodiment of present specification.

FIG. 33 is a cross-sectional view along line M-M' in FIG. 32 according to one embodiment of the present specification.

Referring to FIG. 31, the main magnet 510 may be disposed on the boundary areas between the plurality of adjacent display modules LDM1 to LDM8. In this case, the main magnet 510 may be disposed on the boundary areas between the four adjacent display modules LDM1 to LDM4 or the boundary area between the two adjacent display modules LDM1 and LDM2.

In addition, a larger number of main magnets 510 may be disposed on the area in which more warpage occurs than the area in which less warpage occurs.

Referring to FIGS. 32 and 33, a plurality of main supports 514 integrally protrude from a lower surface of the main magnet 510 at predetermined distances.

When the main magnets 510 are disposed on the boundary areas between the plurality of adjacent display modules LDM1 to LDM8, a magnetic force may be distributed and thus the main magnets 510 may not be firmly fixed to the boundary areas when surfaces of the boundary areas are not uniform and a plurality of uneven portions are present.

Therefore, since the main magnet 510 may be more firmly fixed in close contact with the surfaces of the boundary areas of the plurality of display modules LDM1 to LDM8 due to the magnetic force concentrated on the plurality of main supports 514 by integrally protruding the plurality of main supports 514 from the lower surface of the main magnet 510, the main magnets 510 may be firmly fixed to the boundary areas of the plurality of display modules LDM1 to LDM8.

The main magnets 510 are disposed on the boundary areas connecting the plurality of adjacent display modules LDM1 to LDM8 to have the largest contact area and magnetic force.

In particular, the main magnet 510 may be necessarily disposed on the boundary areas between the plurality of adjacent display modules LDM1 to LDM8.

Figure 34:
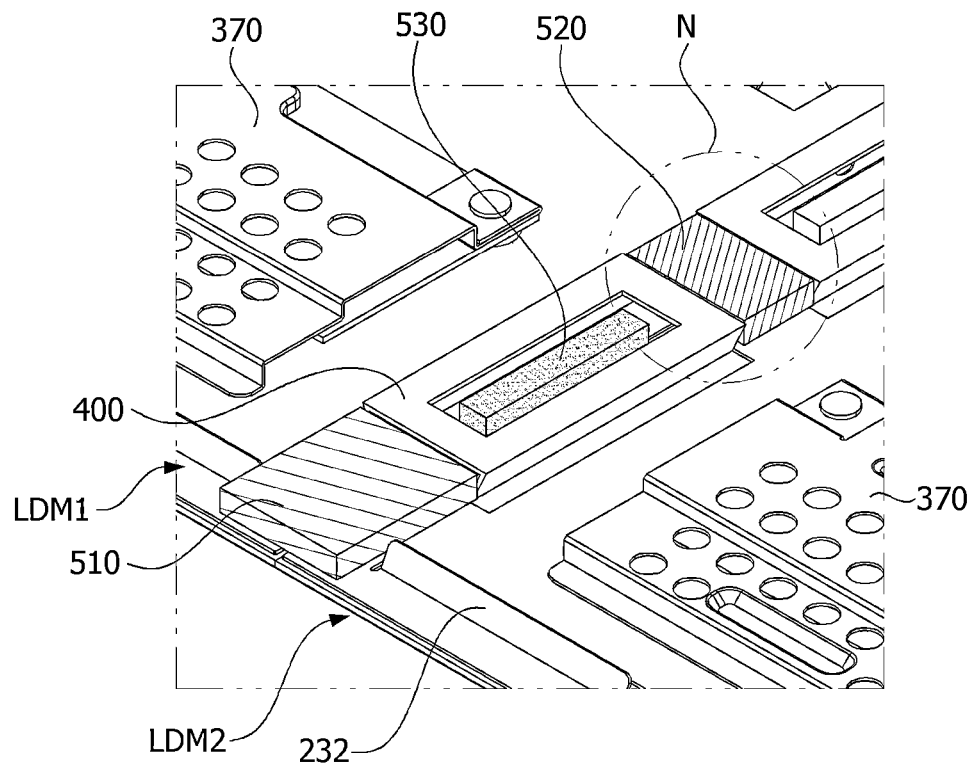
FIG. 34 is a perspective view illustrating a sub-magnet disposed between the plurality of adjacent module brackets in the display device according to embodiment of the present specification.

FIG. 34 is a perspective view illustrating a sub-magnet disposed between the plurality of adjacent module brackets in the display device according to the one embodiment of the present specification.

Figure 35:
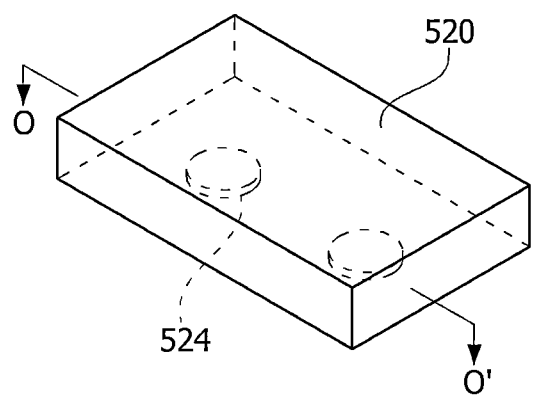
FIG. 35 is an enlarged perspective view of portion N in FIG. 34 according to one embodiment of the present specification.

FIG. 35 is an enlarged perspective view of portion N in FIG. 34 and a perspective view illustrating a sub-magnet disposed between the plurality of module brackets according to one embodiment of the present specification.

Figure 36:
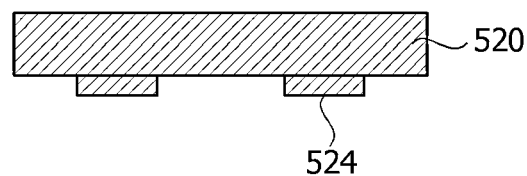
FIG. 36 is a cross-sectional view along line O-O' in FIG. 35 according to one embodiment of the present specification.

FIG. 36 is a cross-sectional view along line O-O' in FIG. 35 according to one embodiment of the present specification.

Referring to FIG. 34, the plurality of sub-magnets 520 are disposed between the plurality of module brackets 400 into which the plurality of protruding portions 232 provided on the cover bottom 200 coupled to the rear surface of each of the plurality of adjacent display modules LDM1 to LDM8 are fixed by being inserted.

Referring to FIGS. 35 and 36, a plurality of sub-supports 524 integrally protrude from the lower surface of the sub-magnet 520 at a predetermined distance.

When the sub-magnets 520 are disposed between the plurality of module brackets 400, that is, on the boundary areas between the plurality of adjacent display modules LDM1 to LDM8, a magnetic force may be distributed and thus the sub-magnets 520 may not be firmly fixed to the boundary areas when surfaces of the boundary areas are not uniform and a plurality of uneven portions are present.

Therefore, since the sub-magnet 520 may be more firmly fixed in close contact with the areas between the plurality of module brackets 400, that is, the surfaces of the boundary areas of the plurality of display modules LDM1 to LDM8 due to the magnetic force concentrated on the plurality of sub-supports 524 by integrally protruding the plurality of sub-supports 524 from the lower surface of the sub-magnet 520, the sub-magnets 520 may be firmly attached to the surfaces of the areas of the plurality of module brackets 400.

The sub-magnet 520 is firmly disposed between the plurality of module brackets 400 and serves to minimize or at least reduce the warpage occurring between the plurality of module brackets 400.

Although the sub-magnet 520 does not need to be disposed between each pair of the plurality of adjacent module brackets 400, like the main magnet 510, a larger number of support magnets 530 may be disposed on the areas in which more thermal deformation occurs than the areas in which less thermal deformation occurs. This is because, when a large number of sub-magnets 520 are disposed on the area in which more warpage occurs, heat can be effectively discharged to the outside through the rail frame 600 in contact with the upper portion of the sub-magnet 520 through the sub-magnet 520, thereby minimizing the warpage phenomenon.

Figure 37:
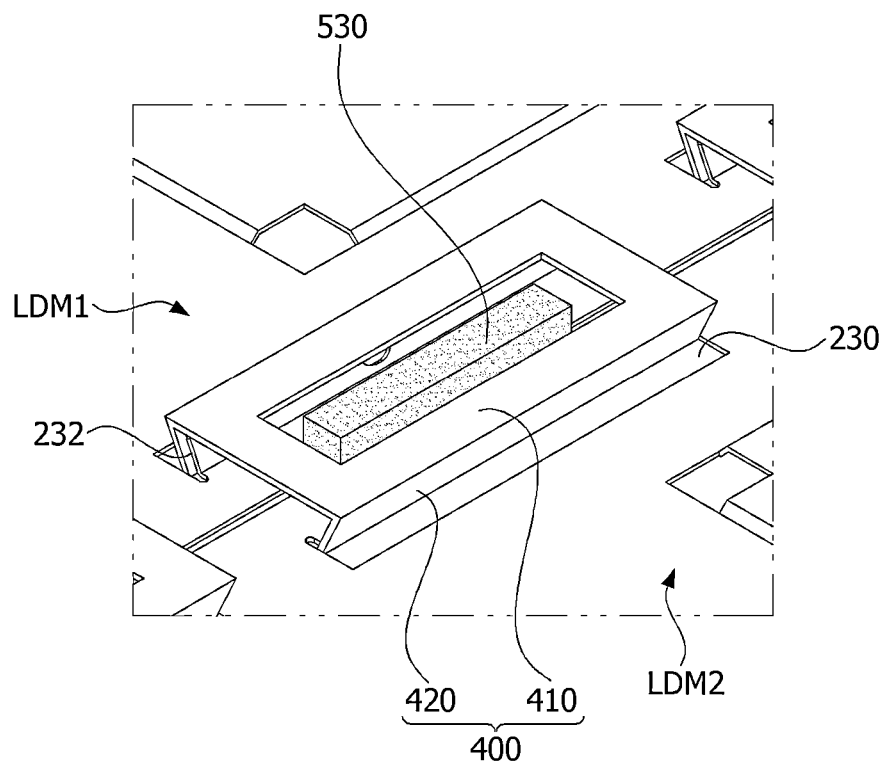
FIG. 37 is a perspective view illustrating the support magnet disposed in the module bracket in the display device according to one embodiment of the present specification.

FIG. 37 is a perspective view illustrating the support magnet disposed in the module bracket in the display device according to the one embodiment of the present specification.

Figure 38:
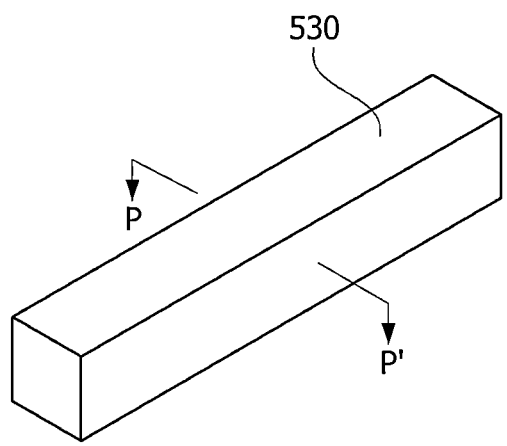
FIG. 38 is an enlarged perspective view of the support magnet according to one embodiment of the present specification.

FIG. 38 is an enlarged perspective view of the support magnet according to one embodiment of the present specification.

Figure 39:
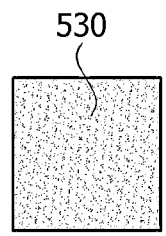
FIG. 39 is a cross-sectional view along line P-P' in FIG. 38 according to one embodiment of the present specification.

FIG. 39 is a cross-sectional view along line P-P' in FIG. 38 according to one embodiment of the present specification.

Referring to FIGS. 37 to 39, the support magnet 530 is configured in a linear shape, inserted into the opening 430 of the module bracket 400, and disposed on the boundary area between the plurality of adjacent display modules LDM1 and LDM2.

The support magnet 530 is disposed to protrude upward from the opening 430.

Since the support magnet 530 is fixed by being inserted into the insertion groove 630 formed in the lower surface of the rail frame 600 disposed thereabove in a state of protruding upward from the opening 430, the plurality of adjacent display modules LDM1 to LDM8 are fixedly coupled by the support magnets 530 and the rail frame 600.

Although the support magnet 530 does not need to be disposed on each of the plurality of adjacent module brackets 400, like the main magnet 510, a larger number of support magnets 530 may be disposed on the areas in which more thermal deformation occurs than the areas in which less thermal deformation occurs.

When a large number of support magnets 530 are disposed on the area in which more warpage due to thermal expansion occurs, heat can be effectively discharged to the outside through the rail frame 600 in contact with the upper portion of the support magnet 530 through the support magnet 530, thereby minimizing the warpage phenomenon.

Although not illustrated in the drawings, the plurality of supports (not illustrated) may be formed to integrally protrude from the lower surface of the support magnet 530. This may allow the support magnet 530 to be more firmly fixed in close contact with the inner lower area of the module bracket 400, that is, the surfaces of the boundary areas between the plurality of display module LDM1 to LDM8 due to the magnetic force concentrated on the support (not illustrated).

FIGS. 40A to 40E are views illustrating a process of assembling the plurality of display modules, the module brackets, the plurality of magnets, and the rail frame, which constitute the display device in the display device according to one embodiment of the present specification.

Figure 40A:
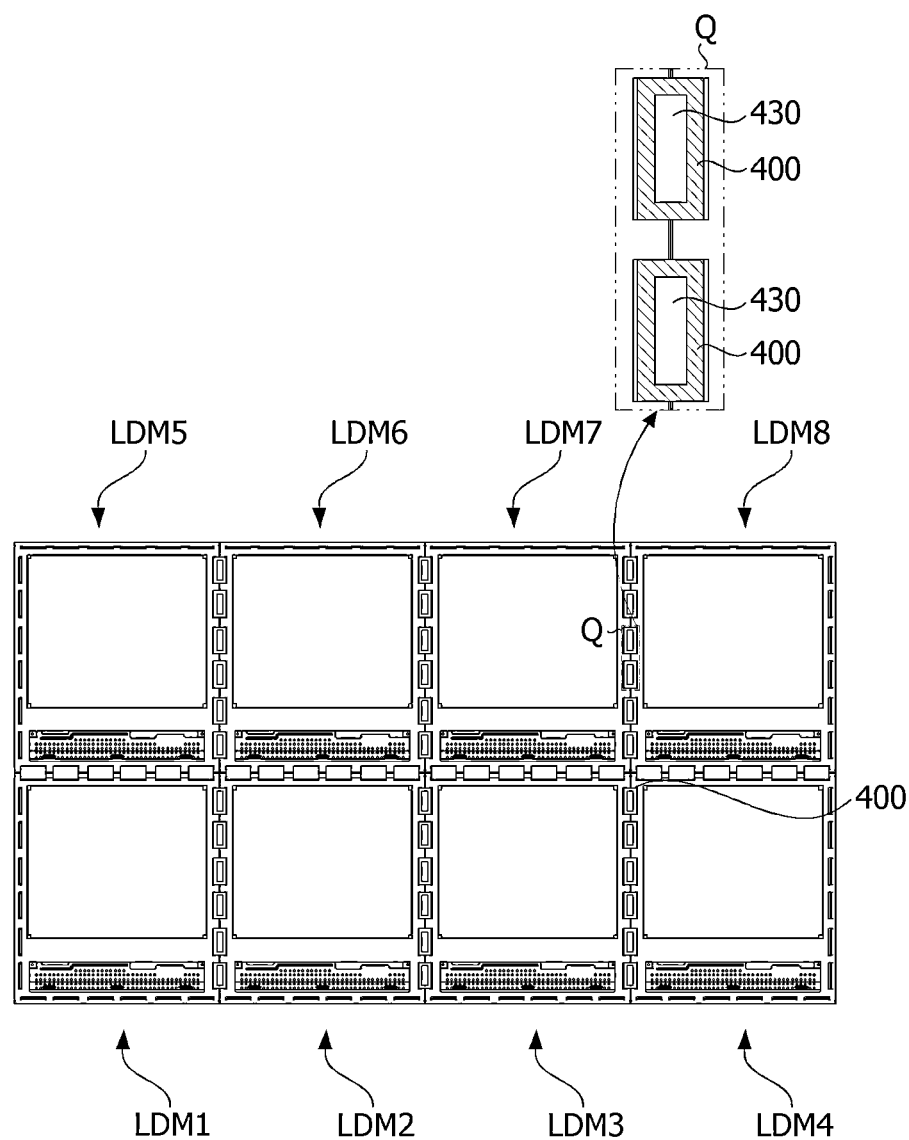
FIGS. 40A to 40E are views illustrating a process of assembling the plurality of display modules, the module brackets, the plurality of magnets, and the rail frame, which constitute the display device in the display device according to one embodiment of the present specification.

Referring to FIG. 40A, the module brackets 400 are fastened to each of the plurality of adjacent display modules LDM1 to LDM8 to connect the plurality of display modules LDM1 to LDM8.

In this case, the module brackets 400 are fastened to the protruding portions (not illustrated) of each of the plurality of adjacent display modules LDM1 to LDM8.

Therefore, the plurality of display modules LDM1 to LDM8 can implement one large screen.

Figure 40B:
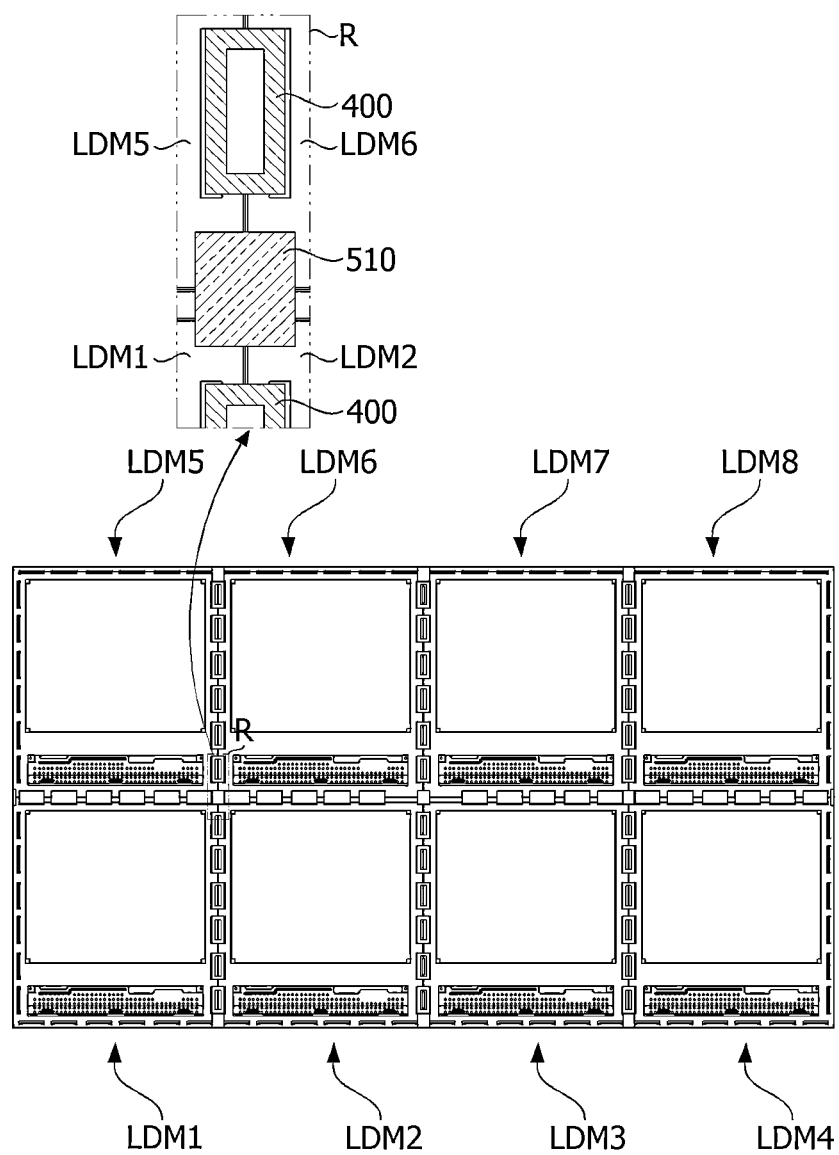

Then, referring to FIG. 40B, the main magnets 510 may be disposed on the boundary areas between the plurality of adjacent display modules LDM1 to LDM8. In this case, the main magnets 510 may be disposed on the boundary areas between the four adjacent display modules LDM1 to LDM4 or the boundary area between the two adjacent display modules LDM1 and LDM2.

In addition, a larger number of main magnets 510 may be disposed on the area in which more warpage occurs than the area in which less warpage occurs.

In addition, the main magnet 510 may be necessarily disposed on the boundary areas between the plurality of adjacent display modules LDM1 to LDM8.

Therefore, the main magnets 510 are disposed on the boundary areas connecting the plurality of adjacent display modules LDM1 to LDM8 to have the largest contact area and magnetic force.

Figure 40C:
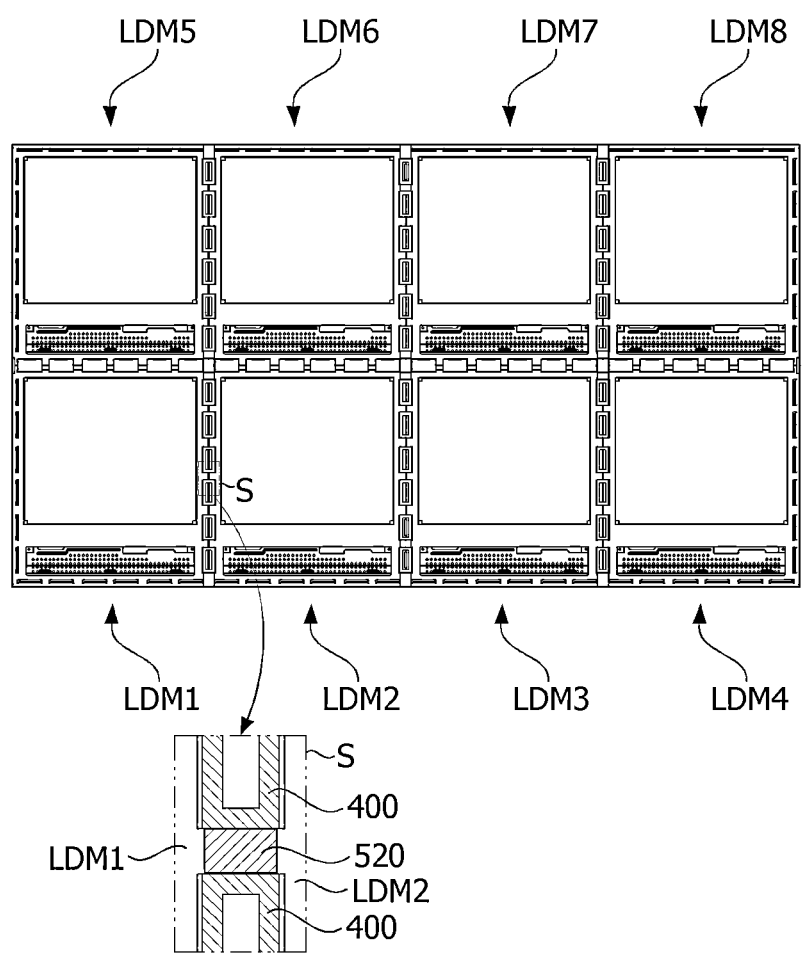

Subsequently, referring to FIG. 40C, the plurality of sub-magnets 520 are disposed on the areas between the module brackets 400 connecting the plurality of adjacent display modules LDM1 to LDM8.

In this case, the sub-magnets 520 are disposed between the plurality of module brackets 400 and serve to minimize or at least reduce the warpage occurring between the plurality of module brackets 400.

Although the sub-magnet 520 does not need to be disposed between each pair of the plurality of adjacent module brackets 400, like the main magnet 510, a larger number of support magnets 530 may be disposed on the areas in which more thermal deformation occurs than the areas in which less thermal deformation occurs.

When a large number of sub-magnets 520 are disposed on the area in which more warpage occurs, heat can be effectively discharged to the outside through the rail frame 600 in contact with the upper portion of the sub-magnet 520 through the sub-magnet 520, thereby minimizing or at least reducing the warpage phenomenon.

Figure 40D:
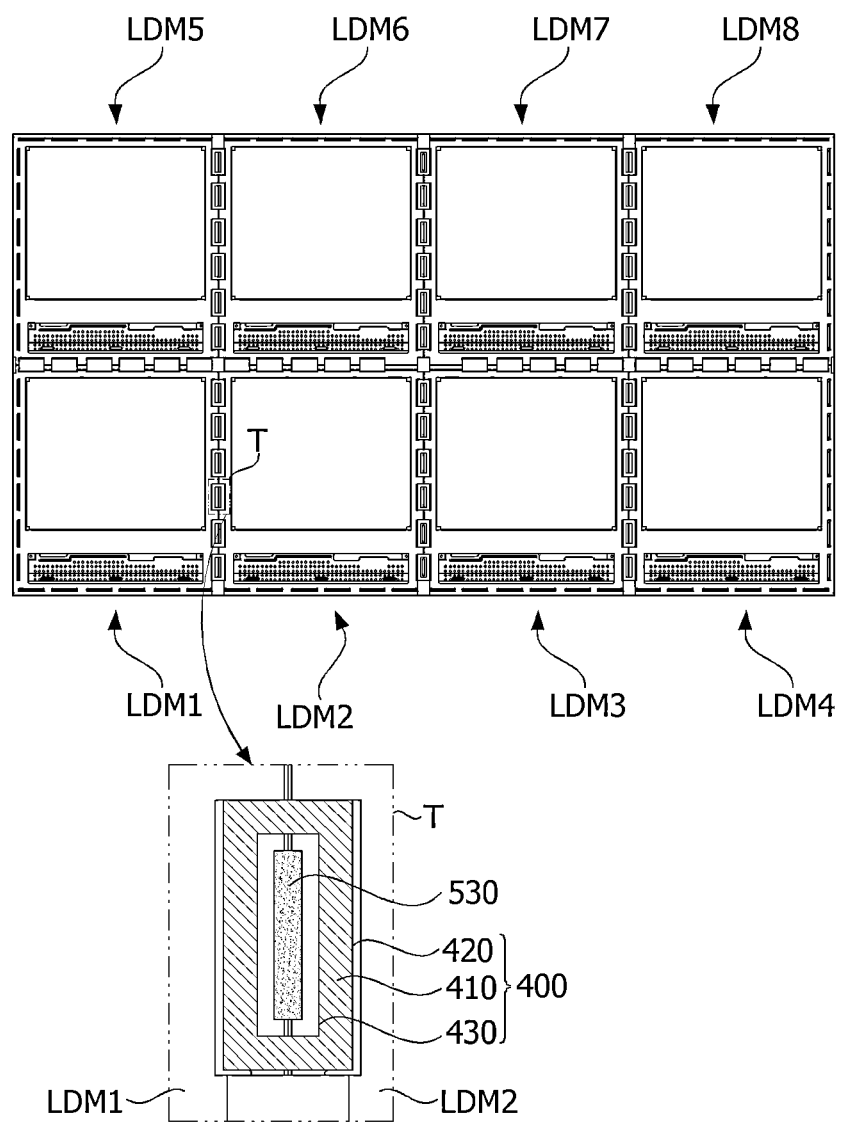

Subsequently, referring to FIG. 40D, a portion of the support magnet 530 is disposed to protrude upward from the opening 430 in a state of being disposed in the boundary area between the adjacent display modules LDM1 and LDM2 positioned in the module bracket 400 through the opening 430 of the module bracket 400.

Although the support magnet 530 does not need to be disposed on each of the plurality of adjacent module brackets 400, like the main magnet 510, a larger number of support magnets 530 may be disposed on the areas in which more thermal deformation occurs than the areas in which less thermal deformation occurs.

When a large number of support magnets 530 are disposed on the area in which more warpage occurs, heat can be effectively discharged to the outside through the rail frame 600 in contact with the upper portion of the support magnet 530 through the support magnet 530, thereby minimizing or at least reducing the warpage phenomenon.

Figure 40E:
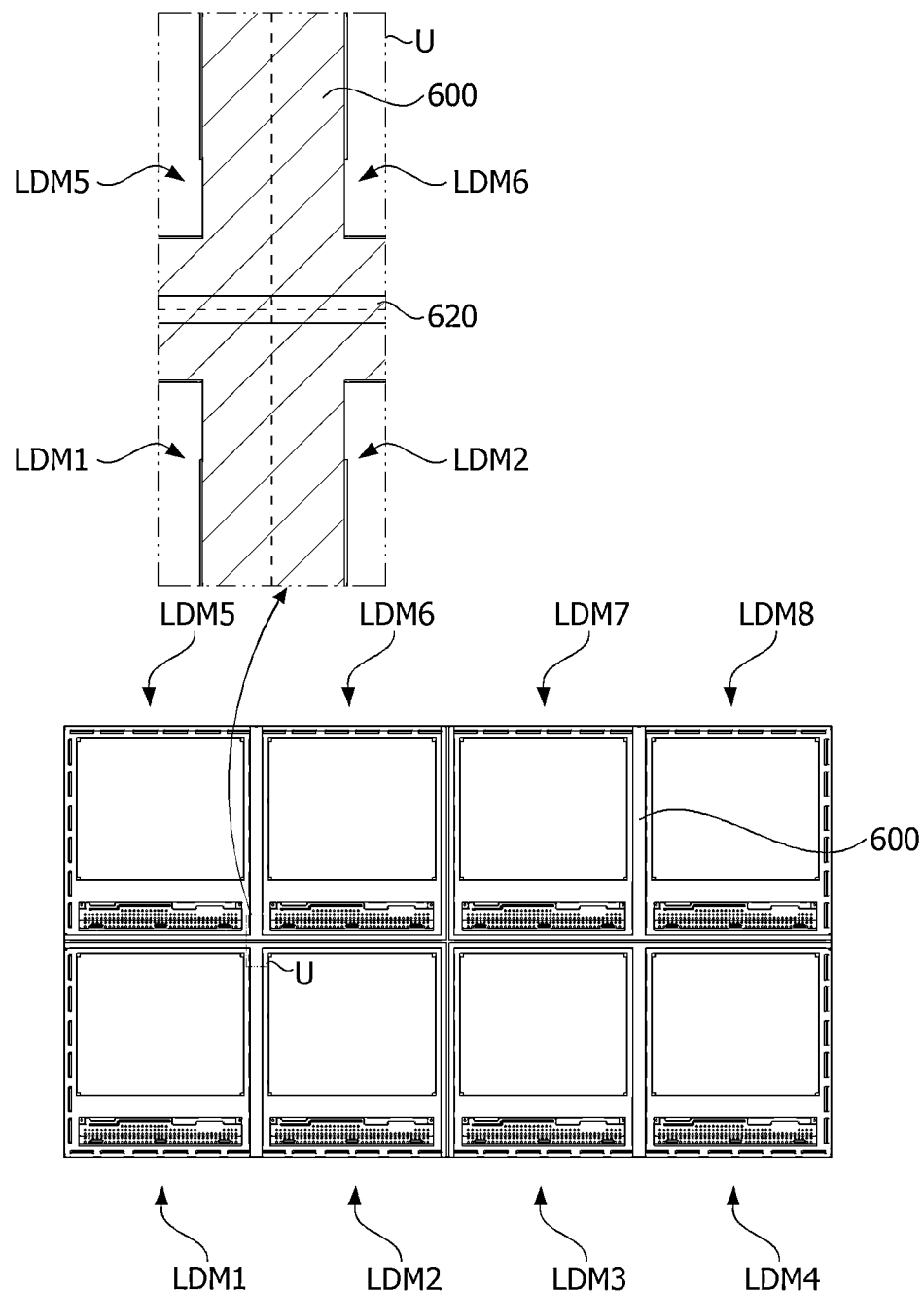

Then, finally, referring to FIG. 40E, the rail frame 600 is disposed in contact with the main magnets 510, the sub-magnets 520, and the support magnets 530 positioned on areas overlapping the boundary areas of the plurality of adjacent display modules LDM1 to LDM8.

As described above, the rail frame 600 fixedly couples the plurality of display modules LDM1 to LDM8 in a state of being in contact with the plurality of module brackets 400 and the plurality of main magnets 510, sub-magnets 520, and support magnets 530.

In this case, the support magnet 530 is fastened by being inserted into the insertion groove 630 formed in the lower surface of the rail frame 600 in a state of protruding from the upper end of the module bracket 400.

The rail frame 600 may firmly fix each of the plurality of display modules LDM1 to LDM8 and serve as a heat sink for discharging the heat generated from each display module to the outside.

Therefore, since the reinforcement portion 620 is formed to protrude from the body portion 610 in the longitudinal direction of the body portion 610 in the rail frame 600 to increase the rigidity of the rail frame, the plurality of display modules LDM1 to LDM8 may be firmly and fixedly coupled by the module brackets and the plurality of magnets.

The plurality of display modules LDM1 to LDM8 may be firmly and fixedly coupled to be replaced through the plurality of module brackets, the plurality of magnets, and the rail frame 600 to increase the heat discharge efficiency to the outside, and thus may serve as a heat sink.

Figure 41:
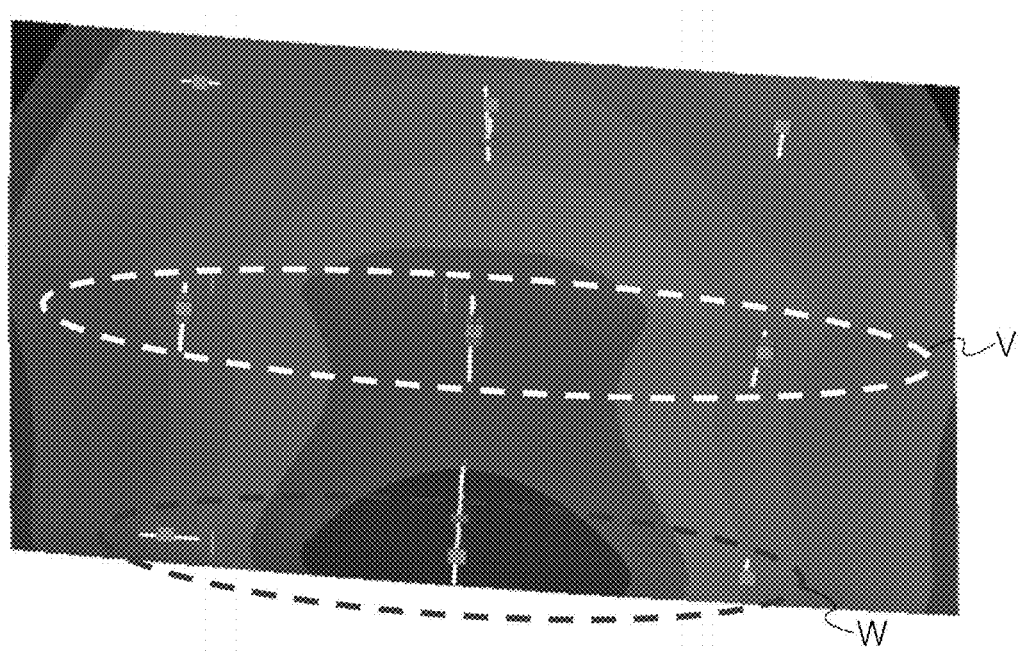
FIG. 41 is a view illustrating a state in which a plurality of magnets are additionally disposed on an area in which the warpage due to thermal deformation is severe in the display device according to one embodiment of the present specification.

FIG. 41 is a view illustrating a state in which a plurality of magnets are additionally disposed on an area in which the warpage due to thermal deformation is severe in the display device according to one embodiment of the present specification.

Referring to FIG. 41, thermal deformation positions can be effectively controlled by additionally arranging the sub-magnet 520 and the support magnet 530 on the area in which more thermal deformation occurs like portions V and W.

In addition, by checking the thermal deformation positions predicted in an arrangement stage before the plurality of display modules LDM1 to LDM8 are assembled, the sub-magnet and the support magnet may be additionally disposed on the area in which the rail frame is disposed.

In addition, by additionally arranging the sub-magnet and the support magnet to firmly fix the rail frame to the display modules, it is possible to minimize or at least reduce the warpage.

Therefore, by firmly fixing the rail frame to the display modules to increase the heat discharge efficiency to the outside, it is possible to expect the role of the heat sink.

Furthermore, since the magnet which can be easily separated when the plurality of display modules are fixedly coupled is used, it is possible to easily replace the display module upon replacement.

Since the plurality of display modules may be easily fixedly coupled using the rail frame, it is possible to effectively control the warpage regardless of the arrangement of the display modules.

Display devices according to various embodiments of the present specification may be described as follows.

A display device according to one embodiment of the present specification may include a plurality of display modules, a plurality of module brackets fastened to a boundary area between adjacent display modules to couple the adjacent display modules, a plurality of magnets disposed in the boundary area between the adjacent display modules, and a rail frame disposed on the plurality of module brackets and the plurality of magnets in the boundary area between the adjacent display modules and coupled by magnetic forces of the magnets.

According to one or more embodiment of the present disclosure, the rail frame may include a body portion overlapping the boundary areas between the adjacent display modules, a reinforcement portion protruding from an upper surface of the body portion toward the rail frame, and an insertion groove concavely recessed in a lower surface of the body portion. Upper ends of at least some magnets among the plurality of magnets may be inserted into the rail frame.

According to one or more embodiment of the present disclosure, the plurality of magnets may include a main magnet in contact with the rail frame in the boundary areas between the adjacent display modules, a sub-magnet disposed between the adjacent module brackets and in contact with the rail frame in the boundary areas between the adjacent display modules, and a support magnet positioned in the module bracket and in contact with the rail frame in the boundary areas between the adjacent display modules.

According to one or more embodiment of the present disclosure, each of the display modules may include a plurality of protruding portions protruding from an edge of a rear surface of the display module, and the module brackets are detachably fastened to the protruding portions of the adjacent display modules.

According to one or more embodiment of the present disclosure, a distance between the protruding portions facing each other in the adjacent display modules may increase from bottom to top. The module bracket may include an upper flat portion having an opening through which the support magnet passes, a first side surface portion bent from one side of the upper flat portion, and a second side surface portion bent from the other side of the upper flat portion. A distance between the first and second side surface portions may decrease toward rear surfaces of the display modules so that the first and second side surface portions surround the protruding portions facing each other in the adjacent display modules.

According to one or more embodiment of the present disclosure, the protruding portion may include a plurality of locking protrusions formed at regular intervals on outer surfaces in close contact with the first and second side surface portions of the module bracket. A plurality of locking grooves may be formed at regular intervals in an inner surface of the side surface portion of the module bracket in contact with the protruding portion so that the locking protrusions are fixedly caught at positions corresponding to the locking protrusions.

According to one or more embodiment of the present disclosure, the support magnet protrudes upward from the upper flat portion in the module bracket and may be fastened by being inserted into an insertion groove in a lower surface of the rail frame.

According to one or more embodiment of the present disclosure, a plurality of supports may be provided on lower surfaces of the main magnet and the sub-magnet.

According to one or more embodiment of the present disclosure, an opening of the module bracket may be formed to have an area larger than an area of the support magnet.

According to one or more embodiment of the present disclosure, the main magnet and the sub-magnet are disposed at the same height as the module bracket.

A display device according to another embodiment of the present specification may include a first display module, a second display module, a plurality of module brackets fastened to a boundary area between the first display module and second display module adjacent to each other to couple the first and second display modules, a plurality of magnets disposed in the boundary area between the adjacent first and second display modules, and a rail frame disposed on the plurality of magnets between the plurality of module brackets in the boundary area between the adjacent first display module and second display module and coupled by magnetic forces of the magnets.

According to one or more embodiment of the present disclosure, the rail frame may include a body portion overlapping the boundary areas between the adjacent display modules, a reinforcement portion protruding from an upper surface of the body portion toward the rail frame, and an insertion groove concavely recessed in a lower surface of the body portion. Upper ends of at least some magnets among the plurality of magnets may be inserted into the rail frame.

According to one or more embodiment of the present disclosure, the plurality of magnets may include a main magnet in contact with the rail frame in the boundary areas between the adjacent display modules, a sub-magnet disposed between the adjacent module brackets and in contact with the rail frame in the boundary areas between the adjacent display modules, and a support magnet positioned in the module bracket and in contact with the rail frame in the boundary areas between the adjacent display modules.

According to one or more embodiment of the present disclosure, each of the display modules may include a plurality of protruding portions protruding from an edge of a rear surface of the display module, and the module brackets may be detachably fastened to the protruding portions of the adjacent display modules.

According to one or more embodiment of the present disclosure, a distance between the protruding portions facing each other in the adjacent display modules may increase from bottom to top. The module bracket may include an upper flat portion having an opening through which the support magnet passes, a first side surface portion bent from one side of the upper flat portion, and a second side surface portion bent from the other side of the upper flat portion. A distance between the first and second side surface portions may decrease toward rear surfaces of the display module so that the first and second side surface portions surround the protruding portions facing each other in the adjacent display modules.

According to one or more embodiment of the present disclosure, the protruding portion may include a plurality of locking protrusions formed at regular intervals on outer surfaces in close contact with the first and second side surface portions of the module bracket, and a plurality of locking grooves are formed at regular intervals in an inner surface of the side surface portion of the module bracket in contact with the protruding portion so that the locking protrusions are fixedly caught at positions corresponding to the locking protrusions.

According to one or more embodiment of the present disclosure, the support magnet protrudes upward from the upper flat portion in the module bracket and may be fastened by being inserted into an insertion groove in a lower surface of the rail frame.

According to one or more embodiment of the present disclosure, a plurality of supports may be provided on lower surfaces of the main magnet and the sub-magnet.

According to one or more embodiment of the present disclosure, an opening of the module bracket may be formed to have an area larger than an area of the support magnet.

According to one or more embodiment of the present disclosure, the main magnet and the sub-magnet may be disposed at the same height as the module bracket.

Since the contents of the specification described in the above-described technical problem, technical solution, and advantageous effects do not specify the essential features of the claims, the scope of the claims is not limited by the items described in the contents of the specification.

Although embodiments of the present invention have been described in detail with reference to the accompanying drawings, the present invention is not necessarily limited to these embodiments, and various modifications may be carried out without departing from the technical spirit of the present invention. Therefore, the embodiments disclosed in the present invention are not intended to limit the technical spirit of the present invention, but for describing it, and the scope of the technical spirit of the present invention is not limited by these embodiments. It should be understood that the above-described embodiments are illustrative and not restrictive in all respects.

What is claimed is:

1. A display device comprising:
a plurality of display modules;
a plurality of module brackets fastened to boundary areas each including edge portions of adjacent display modules from the plurality of display modules to couple the adjacent display modules;
a plurality of magnets in the boundary areas between the adjacent display modules; and
a rail frame on the plurality of module brackets and the plurality of magnets in the boundary areas between the adjacent display modules and coupled by magnetic forces of the plurality of magnets,
wherein the plurality of magnets include:
a main magnet in contact with the rail frame in the boundary areas between the adjacent display modules;
a sub-magnet between adjacent module brackets from the plurality of module brackets, the sub-magnet in contact with the rail frame in the boundary areas between the adjacent display modules; and
a support magnet positioned in a module bracket from the plurality of module brackets, the support magnet in contact with the rail frame in the boundary areas between the adjacent display modules.

2. The display device of claim 1, wherein the rail frame includes:
a body portion overlapping the boundary areas between the adjacent display modules;
a reinforcement portion protruding upward from an upper surface of the body portion; and
an insertion groove concavely recessed in a lower surface of the body portion, and
upper ends of at least some magnets among the plurality of magnets are inserted into the rail frame.

3. The display device of claim 1, wherein each of the plurality of display modules includes a plurality of protruding portions protruding from an edge of a rear surface of the display module, and
the plurality of module brackets are detachably fastened to the plurality of protruding portions of the adjacent display modules.

4. The display device of claim 3, wherein a distance between protruding portions from the plurality of protruding portions that face each other in the adjacent display modules increases from bottom to top,
wherein a module bracket from the plurality of module brackets includes:
an upper flat portion having an opening through which the support magnet passes;
a first side surface portion bent from one side of the upper flat portion; and
a second side surface portion bent from another side of the upper flat portion, and
a distance between the first side surface portion and the second side surface portion decreases toward rear surfaces of the plurality of display modules such that the first side surface portion and the second side surface portion surround the plurality of protruding portions facing each other in the adjacent display modules.

5. The display device of claim 4, wherein at least one of the plurality of protruding portions includes a plurality of locking protrusions disposed at regular intervals on outer surfaces in contact with the first side surface portion and the second side surface portion of the module bracket, and a plurality of locking grooves are formed at regular intervals in an inner surface of the side surface portion of the module bracket in contact with the protruding portion such that the plurality of locking protrusions are fixedly caught at positions corresponding to the plurality of locking protrusions.

6. The display device of claim 4, wherein the support magnet protrudes upward from the upper flat portion in the module bracket and is fastened by being inserted into an insertion groove in a lower surface of the rail frame.

7. The display device of claim 1, wherein a plurality of supports are on lower surfaces of the main magnet and the sub-magnet.

8. The display device of claim 1, wherein an opening of the module bracket has an area that is larger than an area of the support magnet.

9. The display device of claim 1, wherein the main magnet and the sub-magnet are at a same height as the module bracket.

10. A display device comprising:
a first display module;
a second display module;
a plurality of module brackets fastened to a boundary area including edge portions of the first display module and second display module that are adjacent to each other to couple the first display module and the second display module;
a plurality of magnets in the boundary area between the first display module and the second display module; and
a rail frame on the plurality of module brackets and the plurality of magnets in the boundary area between the first display module and the second display module and coupled by magnetic forces of the plurality of magnets, wherein the plurality of magnets include:
- a main magnet in contact with the rail frame in the boundary area between the first display module and the second display module;
- a sub-magnet disposed between adjacent module brackets from the plurality of module brackets, the sub-magnet in contact with the rail frame in the boundary area between the first display module and the second display module; and
- a support magnet positioned in a module bracket from the plurality of module brackets and in contact with the rail frame in the boundary area between the first display module and the second display module.

11. The display device of claim 10, wherein the rail frame includes:
- a body portion overlapping the boundary area between the first display module and the second display module;
- a reinforcement portion protruding upward from an upper surface of the body portion; and
- an insertion groove concavely recessed in a lower surface of the body portion, and
- upper ends of at least some magnets among the plurality of magnets are inserted into the rail frame.

12. The display device of claim 10, wherein each of the first display module and the second display module includes a plurality of protruding portions protruding from an edge of a rear surface of the first display module or the second display module, and
- the plurality of module brackets are detachably fastened to the plurality of protruding portions of the first display module and the second display module.

13. The display device of claim 12, wherein a distance between the plurality of protruding portions facing each other in the first display module and the second display module increases from bottom to top,
- a module bracket from the plurality of module brackets includes:
  - an upper flat portion having an opening through which the support magnet passes;
  - a first side surface portion bent from one side of the upper flat portion; and
  - a second side surface portion bent from another side of the upper flat portion, and
  - a distance between the first side surface portion and the second side surface portion decreases toward rear surfaces of the first display module such that the first side surface portion and the second side surface portion surround the plurality of protruding portions facing each other in the first display module and the second display module.

14. The display device of claim 13, wherein a protruding portion from the plurality of protruding portions includes a plurality of locking protrusions at regular intervals on outer surfaces in contact with the first side surface portion and the second side surface portions of the module bracket, and a plurality of locking grooves are at regular intervals in an inner surface of the side surface portion of the module bracket in contact with the protruding portion such that the plurality of locking protrusions are fixedly caught at positions corresponding to the plurality of locking protrusions.

15. The display device of claim 13, wherein the support magnet protrudes upward from the upper flat portion in the module bracket and is fastened by being inserted into an insertion groove in a lower surface of the rail frame.

16. The display device of claim 13, wherein the first side surface portion and the second side surface portion are bent inward at an angle in a range from 30 to 70 degrees.

17. The display device of claim 10, wherein a plurality of supports are on lower surfaces of the main magnet and the sub-magnet.

18. The display device of claim 10, wherein an opening of the module bracket has an area larger than an area of the support magnet.

19. The display device of claim 10, wherein the main magnet and the sub-magnet are at a same height as the module bracket.

* * * * *